(12) United States Patent
Alzate et al.

(10) Patent No.: US 11,160,188 B2
(45) Date of Patent: Oct. 26, 2021

(54) CONTROL PANEL MODULE ASSEMBLY DEVICES AND TECHNIQUES

(71) Applicant: Schweitzer Engineering Laboratories, Inc., Pullman, WA (US)

(72) Inventors: Julian M. Alzate, Pullman, WA (US); Cameron Scott Soller, Palouse, WA (US); Bryan Gentry, Moscow, ID (US); Kyle Ellis Hildenbrand, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 17/185,922

(22) Filed: Feb. 25, 2021

(65) Prior Publication Data

US 2021/0267102 A1    Aug. 26, 2021

Related U.S. Application Data

(60) Provisional application No. 62/981,627, filed on Feb. 26, 2020.

(51) Int. Cl.
*H05K 7/14* (2006.01)
*H05K 7/16* (2006.01)
(Continued)

(52) U.S. Cl.
CPC .............. *H05K 7/16* (2013.01); *H02B 1/32* (2013.01); *H02B 1/44* (2013.01); *H05K 5/0226* (2013.01);
(Continued)

(58) Field of Classification Search
CPC .. H05K 5/0226; H05K 5/0256; H05K 7/1417; H05K 7/1462; H05K 7/1465;
(Continued)

(56) References Cited

U.S. PATENT DOCUMENTS 3,394,287 A    7/1968  Zitzmann
5,394,296 A    2/1995  Erickson
(Continued)

OTHER PUBLICATIONS

PCT/US2021/019884 International Search Report and Written Opinion of the International Searching Authority, dated May 5, 2021.
(Continued)

*Primary Examiner* — Peter Dungba Vo
*Assistant Examiner* — Joshua D Anderson
(74) *Attorney, Agent, or Firm* — Stoel Rives LLP; Richard M. Edge

(57) ABSTRACT

Systems, apparatus, methods, and techniques of assembly of discrete modules of a control panel are disclosed. The modules can be independently wired, tested, and installed into a control panel. Module definitions are defined specifying components to perform the electrical function, a mechanical arrangement of the components, electrical connections, and logical interactions of the module. A bill of materials can be generated based on a designation of a set of modules for a control panel and the module definitions. Modularly assembled control panels are disclosed. An assembly frame is described herein for temporarily mounting components of a module for independent assembly of a control module and for eventual removal and installation into a control panel frame. The assembly frame may include a faceplate frame and side frames and temporary mounting features.

10 Claims, 16 Drawing Sheets

(51) Int. Cl.
*H02B 1/44* (2006.01)
*H05K 5/02* (2006.01)
*H02B 1/32* (2006.01)
*H05K 13/00* (2006.01)
*H02B 1/30* (2006.01)
*B25H 1/14* (2006.01)
*B25H 1/18* (2006.01)

(52) U.S. Cl.
CPC ............. *H05K 7/1467* (2013.01); *B25H 1/14* (2013.01); *B25H 1/18* (2013.01); *H02B 1/30* (2013.01); *H05K 13/0069* (2013.01); *Y10T 29/53265* (2015.01); *Y10T 29/53978* (2015.01)

(58) Field of Classification Search
CPC .. H05K 7/1467; H05K 7/1474; H05K 7/1489; H05K 7/16; H05K 7/18; H05K 13/0053; H05K 13/0069; H02B 1/052; H02B 1/066; H02B 1/205; H02B 1/30; H02B 1/32; H02B 1/38; H02B 1/42; H02B 1/44; H02B 1/48; H02B 1/52; H02B 3/00; Y10T 29/53265; Y10T 29/53961; Y10T 29/53978; B25H 1/12; B25H 1/14; B25H 1/18
See application file for complete search history.

(56) References Cited

U.S. PATENT DOCUMENTS

| | | | |
|---|---|---|---|
| 5,588,659 A * | 12/1996 | Boes | B25H 3/04 |
| | | | 280/47.19 |
| 8,148,654 B2 | 4/2012 | Schmidt | |
| 8,251,785 B2 | 8/2012 | Schmitt | |
| 8,347,560 B2 | 1/2013 | Gyory | |
| 9,374,926 B1 | 6/2016 | Fontana | |
| 9,529,940 B2 | 12/2016 | Shaw | |
| 10,096,405 B2 * | 10/2018 | Mohlman | B65H 49/00 |
| 10,832,835 B2 * | 11/2020 | Doolittle | B25H 1/16 |
| 2002/0140325 A1 * | 10/2002 | Webster | H02B 1/50 |
| | | | 312/223.1 |
| 2003/0011988 A1 | 1/2003 | Irmer | |
| 2010/0201230 A1 | 8/2010 | Schweitzer | |
| 2012/0033396 A1 | 2/2012 | Goedknegt | |

OTHER PUBLICATIONS

Cellean Modular Control Panel Catalogue 2018, Schneider Electric, 2018.
Sivacon 8MF1 System Cubicles As Versatile as Your Requirements, Siemens, 2016.

* cited by examiner

CONTROL PANEL MODULE ASSEMBLY DEVICES AND TECHNIQUES

RELATED APPLICATIONS

This application claims priority to U.S. Provisional Patent Application No. 62/981,627, titled CONTROL PANEL ASSEMBLY DEVICES AND METHODS, filed Feb. 26, 2020, the entirety of which is incorporated herein by reference.

TECHNICAL FIELD

This disclosure relates to assembly of control panels. More particularly, this disclosure relates to assembly of discrete modules of a control panel that can be independently wired, tested, and installed into a control panel.

DETAILED DESCRIPTION OF PREFERRED EMBODIMENTS

Figure 1:
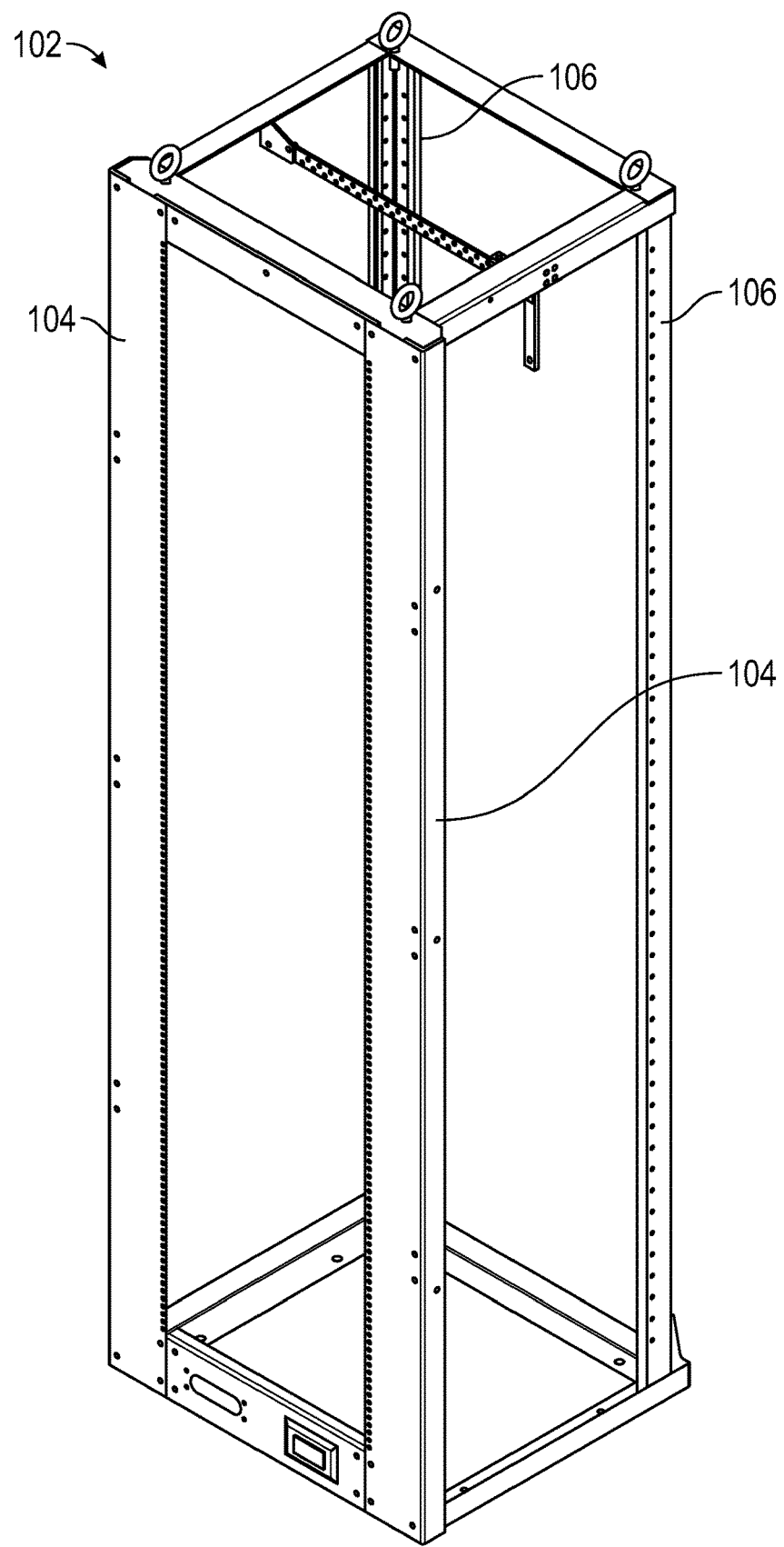
FIG. 1 is a perspective view of a control panel frame, according to one embodiment of the present disclosure.

Control panels are used in utility, industrial, and military installations to house various control, automation, metering, and protection components that pertain to operation of an electrical power system. A key function of control panels often is to present these components for use by personnel. The various components may be housed such that interfaceable portions are visible and readily available to be viewed and used by personnel. The control panel components are often arranged and wired together (and to other hardware or other control panels) according to an application of a site. Such wiring may be housed within the control panel, and often behind the face of the panel, and not seen or directly accessible by personnel.

Often the application of a control panel can be particular and/or unique to the site, such that there is high variability in design and use of control panels. Every site participating in operation of an electrical system is a little bit different. The connection to the electrical power system may be unique for a variety of reasons, including other control panels already installed at the site, the era of construction of the site and/or the adjacent portion of the electrical power system, the existing hardware at the site, and/or the background, experience, and/or preferences of the individuals to be acting as operators at the site. All these factors create highly variable needs, uses, and applications (e.g., collections of functions) to be addressed by control panels, and therefore there is high variability in use and application of control panels, which has led to similarly high variability in the processes of designing and assembling control panels.

For example, while some conventional panels used in some electric utilities measure around 2'×7'×3', the size of panels within electric utilities can vary by around 50%, even in the same utility. In addition to size variability, the components that may be included in and housed in control panels can vary widely. For example, a control panel used by an electric utility may include one or more intelligent electronic devices (IEDs) used for protection, control, automation, and/or metering of electric power equipment, automation controllers, test contacts, human-machine interfaces (HMIs), industrial computers, accurate clocks, communication devices, pushbuttons, switches, status indicators, Deutsches Institut fur Normung (DIN) rails, terminal blocks, cable routing, breakers, and the like.

The high degree of variability of control panels has resulted in presently available processes, prior to the present disclosure, that are inefficient and defect prone. Presently available processes require long lead times for engineering and design before actual assembly of the control panel can be performed. Control panels require electronic design and engineering that require specialized skills that can be a challenge to recruit in today's workforce. Prior to the present disclosure, every custom (e.g., site-specific) control panel would require a custom design from a specialized, highly skilled team, requiring a higher skill level of drafters, engineers, coders, and testers at every step of the design. Sufficiently skilled persons are not readily available to hire and, when they can be found, training these persons takes years.

The actual build time of control panels is also presently long because the high degree of variability of components is such that components cannot be easily maintained on hand and generally must be procured after initial engineering and design of a control panel. The actual build time of control panels is also presently long, partly caused by congestion due to the physical constraints of a control panel frame that limit more than one person at a time from working on assembly (e.g., wiring) of a control panel. These physical constraints affect the time required to mount, wire, and test a control panel.

To effectively handle the variability presented and presently required, control panel design and assembly requires a nimble, large, and highly skilled workforce that adapts to customized/unique ordering, manufacturing, shipping/packaging, installation, testing, and maintenance procedures, and delivery of a site-specific control panel. Even with a highly skilled and highly trained work force, it can take several months to engineer and design and then to assemble a control panel, and the defect rate in control panels assembled through presently available processes has been too high.

Control panel design and assembly therefore introduces and involves challenges related to cost control, quality control, time-intensive engineering rework, re-wiring, and documentation tracking, inventory management, and procurement of components.

The electrical power system industry would like to be able to design, engineer, produce, and otherwise have more readily available the types of control panels that pertain to operation of electrical power systems. Lower lead times for ordering and installing new control panels would enhance the industry. As in any assembly situation, there is interest to create repeatable and predictable processes that can drive up quality and drive down defects.

The uniqueness of each control panel site and application need at that site, and therefore the uniqueness and variability of each implementation of a control panel, presents significant challenges to developing more efficient, repeatable, lower-error rate assembly solutions. The uniqueness and variability have also perpetuated other present challenges to efficient and repeatable processes of designing and assembling control panels. The engineering time presently invested into a control panel is generally insufficient to design a repeatable, low error rate solution. Control panel design documentation is typically insufficiently mature to fully optimize all facets of the design. De-conflicting space congestion or mounting and wiring can be problematic in control panels. Custom control panels are, in effect, considered in the industry to be always in a prototype-like stage.

Specifically, with respect to assembly of control panels, physical parameters and constraints present significant limitations to the assembly process. Because the common dimensions of a panel may extend from ground level to around seven feet tall, the assembly process may include installation of components and wiring well above head-level of the assembly personnel. This introduces several possible sources of injury and strain. Furthermore, because many components may be installed into a single panel, multiple personnel may be needed to work in a single panel to assemble and wire the several components. This introduces physical strain, and increases the time necessary for assembly. Build times of panels may be long, partly caused by congestion of the physical constraint limiting more than one person at a time from wiring in the panel. This affects the time required to mount, wire, and test the panel.

Once a panel has been designed, assembled, and put into use, it may become desirable to update or upgrade the panel or components therein. Control panels that follow the typical design and assembly may be difficult to modify due to the integration of the components in the panel. That is, typical control panels are difficult to upgrade. Older control panel design and assembly methods require customized re-design and modification as the electric power system evolves and upgrades become desirable. For example, many protection and control strategies are expected to change over the next few decades to accommodate distributed energy such as photovoltaic, batteries, and wind. The existing infrastructure was not designed for such rapid changes and upgrades are time consuming and error prone when associated with unique designs.

The present inventors have recognized the desirability of improved assembly processes, systems, devices, and methods to resolve the problems with presently available custom panel design and assembly as described above.

The present disclosure and descriptions herein relate to defining and assembling modules that are a self-contained solution to an electrical function pertaining to operation of an electrical power system, and that can be independently wired, tested, and installed to assemble a control panel. The systems methods and techniques disclosed allow for high predictability and repeatability of design and assembly at a modular level while affording customization and variability at the control panel level.

The present disclosure includes pre-defining modules with a module definition that includes data specifying: components to perform the electrical function; mechanical arrangement of the components; electrical connections, including connections between the components and points of interface with other modules and other equipment of the power system; and logical interactions of the module, including logical connections between the components and logical interfaces with other modules or other equipment of the power system.

The module definitions afford an ability to receive from a customer, an operator, an engineer, or other requester a designation of a set of modules to be included in a control panel to be assembled. In some embodiments, the designation of a set of modules is received at a computing system. Those modules can be pre-manufactured and stocked in inventory or they can be more readily ordered and/or manufactured, thereby decreasing required lead time to ultimately install a control panel. For example, a bill of materials (BoM) can be prepared or otherwise generated based on the designated modules. In some embodiments, a computing system can automatically prepare or otherwise generate a BoM based on the designated modules and the definitions thereof. The BoM can include a listing of all components of every module of the designated set of modules. Stated differently, the BoM can specify a parts list that includes a part listing for each of the one or more components of all the modules in the set of modules designated. The BoM is to be used to order the components according to each part listing in the parts list.

The module approach to assembling control panels can afford an ability to independently wire each module and thereby increase throughput. Rather than assembling all components of a control panel in a control panel frame, as has traditionally been done, the individual modules can be assembled independently, such as at different locations and/ or different points in time, using one or more module assembly frames. Thus, a control panel comprising a plurality of modules (e.g., four modules) can be assembled by assembling the plurality of modules in parallel with a plurality of workers (e.g., four workers) independently wiring each of the plurality of modules. The assembly time is drastically reduced.

The module approach to assembling control panels can afford an ability to have repeatability in manufacturing or assembly of the modules, which can lower costs and defect rates. The assembly of a defined module can be a repeatable process that can be refined to remove errors and lower the defect rate (if not eliminate defects entirely). The repeatability of the process also opens opportunity for a workforce that has less experience and/or skill (at least lesser than may be needed for a process that is, in essence, creating a custom panel every time).

The present disclosure and descriptions herein also relate to modularly assembled control panels that are assembled using one or more pre-defined and independently wired and discretely functioning modules. A set of modules is designated for assembly into a control panel. The set of modules may be designated for the panel, such as by a user, customer, engineer, or a control panel definition.

The present disclosure and descriptions herein also relate to reusable assembly frames that may be used as a subassembly station for independently assembling modules for inclusion in a control panel. A module can be assembled at the assembly frame, including arranging components and wiring components together as if directly into a panel. The fully assembled (and optionally tested) module can then be transferred from the assembly frame to the control panel frame. The reusable assembly frames simplify not only the module assembly process, but also the design and assembly of control panels, as the design and assembly may be performed in a modular manner. The assembly frame may be included as an element of an assembly station that provides portability and height adjustability.

In accordance with several embodiments described herein, components and wiring for one module of a control panel are designed for assembly in an assembly frame. The components, face plate, and wiring are then assembled into the assembly frame. The assembly frame may be mounted on a configurable assembly station such that the installation personnel may perform the assembly at their convenience, absent conflict with assembly of other modules of the control panel. The modularity of the design and the assembly frames enable multiple modules to be assembled in parallel or otherwise concurrently, eliminating physical constraints that have previously limited the number of personnel assembling a control panel.

Once the control module is assembled on the assembly frame, including the face plate, components, support features, DIN rails, terminal blocks, and wiring, the assembled module may be removed from the assembly frame and installed into the control panel frame. Multiple assembled control modules may be assembled in parallel at separate assembly frames and installed into the control panel frame to produce a control panel.

The assembly frame may include a faceplate frame moveably connected to side frames. The faceplate frame may accept a face plate that will become part of the control panel upon mounting to the control panel frame. The side frames may be connected to the faceplate frame using hinges to provide easier access to different portions of the assembly. The side frames may include mounting features for temporarily mounting DIN rails and other support features. With the faceplate and other components installed in the faceplate frame and the side frames, wiring among the components may be performed with the components in the assembly frame.

The assembly frame may be transported (e.g., as part of a movable assembly station) to the control panel frame on the adjustable workstation. The adjustable workstation may lift the assembly frame with the assembled module (and installed components thereof) to an appropriate level of the control panel frame. Once at the desired level, the assembled module may be removed from the assembly frame and installed into the control panel frame. For example, the faceplate with installed components may be removed from the assembly module and installed into the control panel frame. The support components, DIN rails, wiring, and other components temporarily installed into the assembly frame may also be installed into the control panel frame.

Modules installed into the control panel can be wired to other electrical power system hardware and/or connected at points of interface of the module (or otherwise wired together as appropriate) to accomplish an intended application (e.g., a set of functions pertaining to operation of an electrical power system) of an electrical system operator for which the control panel was designed, ordered, or otherwise requested or intended to be built.

In accordance with several embodiments described herein, components and wiring for one control module of a control panel are designed for assembly in an assembly frame. The components, face plate, and wiring are then assembled into the assembly frame. The assembly frame may be mounted on a configurable workstation such that the installation personnel may perform the assembly at their convenience. Once the control module is assembled on the assembly module, including the face plate, components, support features, DIN rails, terminal blocks, and wiring, the assembled control module may be removed from the assembly module and installed into the control panel frame. Multiple assembled control modules may be assembled in parallel in separate assembly frames and installed into the control panel frame to produce a control panel.

FIG. 1 is a perspective view of a control panel frame 102, according to one embodiment of the present disclosure. The control panel frame 102 may include a front support 104 and a back support 106. The front and back supports 104, 106 may include mounting features to which the various control panel components may be mounted to form the control panel. For example, the front support 104 may be configured to have a face plate of a module mounted thereto for presenting user-interfacing components to an operator of an electrical power system or other user. The back support 106 may provide structure to which mounting brackets of a module, such as cross braces, can be mounted. For example, one or more cross braces of a module can be mounted and positioned to extend between the front support 104 and the back support 106, thereby stabilizing an installation of a module. Further, the mounting brackets or cross braces provide additional structure to which other components of modules can be attached during independent assembly of the module for installation into the control panel frame 102 during control panel assembly.

Figure 2:
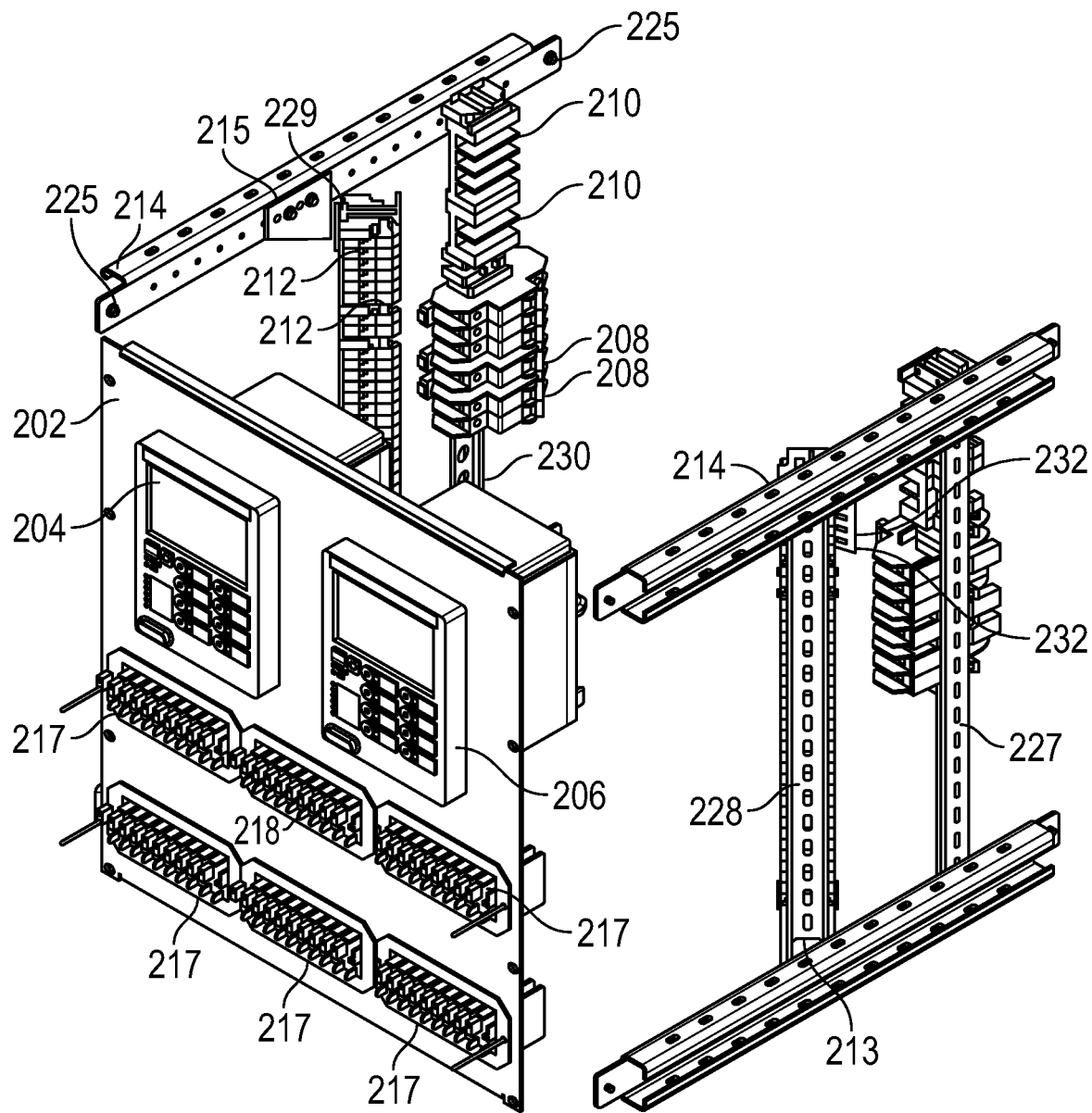
FIG. 2 is a perspective exploded view of a module of a control panel, according to one embodiment of the present disclosure, illustrating components of the module.

FIG. 2 is a perspective exploded view of a module 200 of a control panel, according to one embodiment of the present disclosure, illustrating components of the module 200. Once assembled, the module 200 can be mounted or otherwise installed in a control panel frame (e.g., the control panel frame 102 of FIG. 1) to assemble a control panel. The control panel can be a customized control panel that is customized for a given installation site. The components of the module 200 may include, among others: a face plate 202, into which various IEDs 204, 206 (and/or user-interfacing devices), test switches 217, and the like may be installed; cross braces 214 and/or DIN rails (or terminal block rails) 227, 228, 229, 230; circuit breakers 208; jumpers 232; terminal blocks 210, 212; and so forth. The cross braces 214 may be temporarily mounted to a side frame of an assembly frame or more permanently mounted in a control panel frame with screws 225. The DIN rails 227, 228, 229, 230 may be directly mounted to the cross braces 214 or mounted to the cross braces 214 via mounting brackets 213, 215.

As can be seen, before assembly into a control panel frame, certain of the components of a module are freestanding and otherwise not interconnected or otherwise coupled together. Previously, assembly of components into a control panel required direct assembly (or installation) of these components into the control panel frame, which generally resulted in the deficiencies described above. Accordingly, the present disclosure provides assembly systems, methods, devices and techniques that enable assembly of discretely functioning and independently assembled (e.g., wired) and tested modules. As described in more detail herein, components of a discrete module may be temporarily installed and wired before intended installation into a control panel. Installation onto the control panel frame then involves simple removal of the face plate 202 and cross braces 214 and transfer and mounting of the face plate 202 and cross braces 214 into the control panel frame.

The systems, methods, devices, and techniques disclosed herein allow for modular design, assembly of multiple modules in parallel (including wiring), enhanced reproducibility, fewer personnel performing installation in a control panel frame during the same time period, easier upgradability of components, and more ergonomic installation conditions during assembly, and multiple other improvements.

Figure 3:
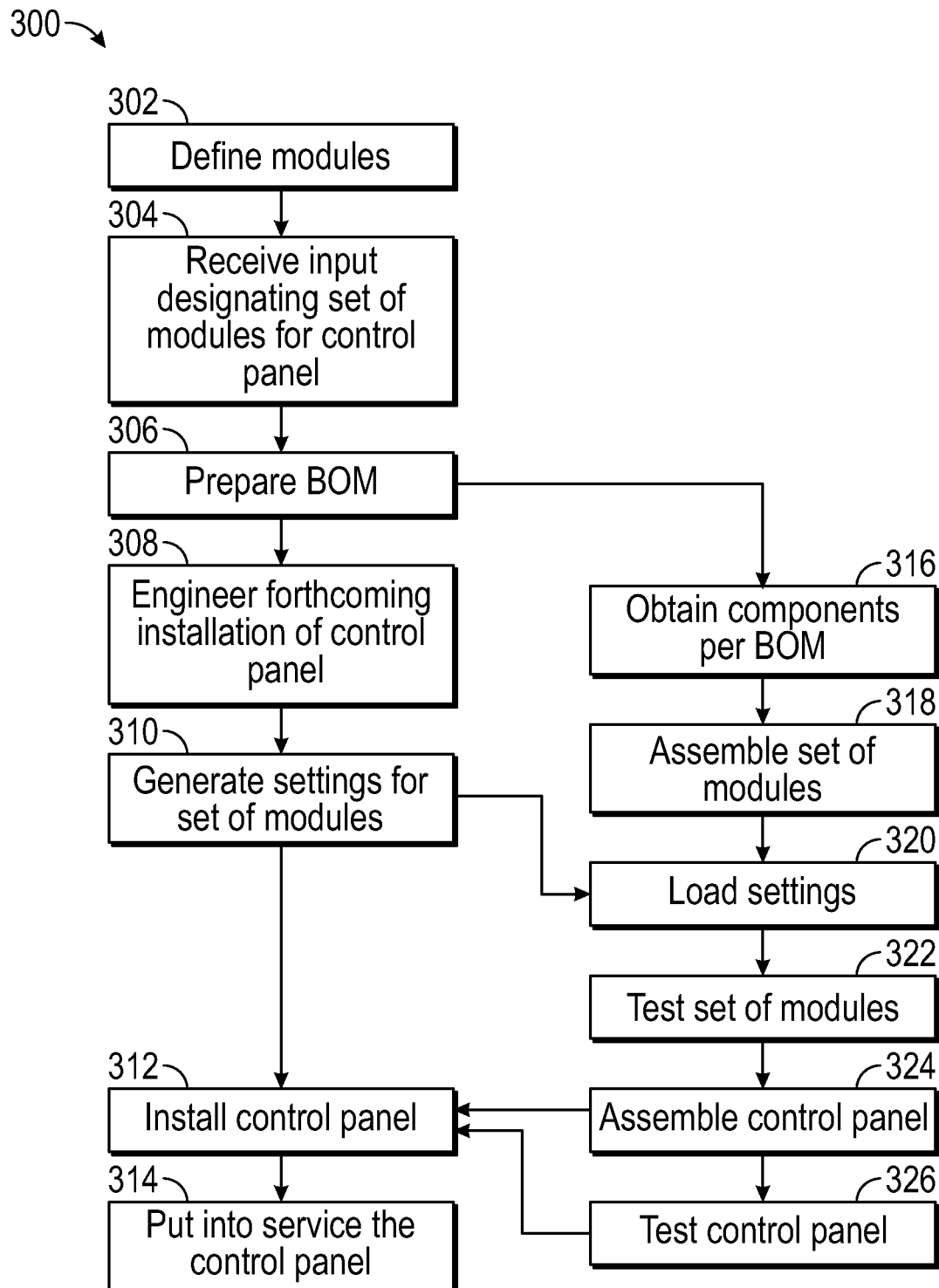
FIG. 3 is a flow diagram of a method of assembling a control panel, according to one embodiment of the present disclosure.

FIG. 3 is a flow diagram of a method 300 of assembling a control panel, according to one embodiment of the present disclosure. Modules are defined 302, for example, according to common or standard functions pertaining to operation of the electrical power system. Some examples of common or standard functions include but are not limited to:

overcurrent protection
distance protection
differential protection
voltage protection
voltage control
frequency control
breaker control
peak metering
demand metering
revenue metering
power quality metering
arc flash protection
precise time synchronization
communications and networking
automation
data concentration
protocol conversion
secure access
cybersecurity
annunciation and visualization
operation
redundant power
remote metering
status indication
control
situational awareness A module can be related to one or multiple applications of a control panel. A control panel is intended to provide a solution to an application pertaining to operation of an electrical system. An application may be a collection of one or more functions that pertain to operation of an electrical system. Applications generally are related to main components of an electrical power system that need to be operated. Some examples of applications include but are not limited to:

Line protection, control and monitoring
Transformer protection, control and monitoring
Bus protection, control and monitoring
Feeder protection, control and monitoring
Capacitor bank protection, control and monitoring
Substation automation and control
Microgrid control
Bay control
Distribution automation
Power management The modules are included in a control panel to perform functions toward a broader application of a panel.

The modules are defined 302 to be a self-contained or discrete solution that performs one or more electrical functions pertaining to operation of the electrical power system. In some embodiments, a module can perform a single function. In some embodiments, a module can perform multiple functions. The modules are defined 302 with a module definition that includes data specifying: components to perform the electrical function(s); a mechanical arrangement of the components to facilitate human interaction, use, and independent manufacture and testing of the module; electrical connections, including connections between the components and points of electrical interface with other modules and other equipment of the power system; and logical interactions, including logical connections between the components to perform the electrical function and logical interfaces with other modules or other equipment of the power system. Each module is designed and defined 302 to be discretely functional and independently wired, tested, and installed in a control panel.

Defining 302 module definitions allows for high predictability and repeatability of design and assembly at a modular level while affording customization and variability at the control panel level. Modules can be pre-manufactured and stocked in inventory or they can be more readily ordered and/or manufactured, thereby decreasing required lead time to ultimately install a control panel. As will be described more fully, rather than assembling all components of a control panel in a control panel frame, as has traditionally been done, defining modules can allow modules to be assembled independently, such as at different locations and/or at different points in time. A control panel comprising a plurality of modules can be assembled by assembling the plurality of modules in parallel with a plurality of workers (e.g., four workers) independently wiring each of the plurality of modules, thereby reducing assembly time. Further, defining 302 modules to assemble control panels can afford an ability to have repeatability in manufacturing or assembly of the modules, which can lower costs and defect rates. The assembly of a defined module can be a repeatable process that can be refined to remove errors and lower the defect rate (if not eliminate defects entirely). The repeatability of the process also opens opportunity for a workforce that has less experience and/or skill (at least lesser than may have been previously needed for, in effect, creating a custom panel every time).

The module definitions afford an ability to receive 304 input designating a set of modules to be included in a control panel to be assembled. The input may be received 304 from a customer, an operator, an engineer, or other requester. In some embodiments, the designation of a set of modules is received 304 at a computing system. For example, a selection interface may be presented on a computing device (e.g., a client computing device, a mobile smartphone, a tablet, a laptop) that provides a listing of modules from which the set of modules can be selected or otherwise designated. In some embodiments, the designation of the set of modules may be received over a communication network.

In some embodiments, the input received may be a listing of the modules in the set of modules. In some embodiments, the input may be a control panel definition that includes a designation of modules to be included in the control panel. In some embodiments, the input may be in the form of a control panel order. A customer, an operator, an engineer, or another requester can determine a control panel application (e.g., a collection of functions) to be used in operating an electrical system and accordingly order a control panel. The order or request for the control panel may be for a standard control panel product, a modification of a control panel product, or a custom-designed control panel. Regardless of the manner of requesting the control panel, an engineer or a computing system can generate a set of modules and a designation of that set of modules can be received 304.

A BoM can be prepared 306 or otherwise generated based on the designated modules. Module definitions that include data specifying components to be included in the module enable a BoM to be generated from a designation of a set of components. In some embodiments, a computing system can automatically prepare 306 or otherwise generate a BoM based on the designated modules and the definitions thereof. The BoM can include a listing of all components of every module of the designated set of modules. Stated differently, the BoM can specify a parts list that includes a part listing for each of the one or more components of all the modules in the set of modules designated. The BoM is to be used to order the components according to each part listing in the parts list.

The components according to the parts list of a BoM can be obtained 316, such as by ordering from a third-party or by initiating manufacture of the components. Having a parts list from a BoM at a point in time near to when a control panel (or application) is requested can drastically reduce lead time for assembling and installing a control panel. The components can be obtained 316 or otherwise sourced while continued engineering 308 of the forthcoming installation of the control panel is ongoing. In some embodiments, the obtaining 316 of components per the BoM can occur in parallel to, or otherwise concurrently with, ongoing engineering 308.

Once the components are obtained 316, the set of modules can be assembled 318. The modular design and module definition allows each module to be independently assembled 318. The modules are each assembled according to a corresponding module definition. The components are arranged according to a mechanical arrangement specified in the module definition. The components are wired or otherwise electrically connected and electrical interfaces are defined according to electrical connections specified in the module definition. Logical interactions, including logical connections between the components to perform the electrical function and logical interfaces with other modules or other equipment of the power system, are formed according to the module definition.

The modules can be loaded 320 with settings that provide customization of the functions of the modules, and thereby the application of the control panel. The settings can be loaded 320 by uploading a file to the module and/or components of the module. For example, in one embodiment a settings file may be uploaded to each component. In another embodiment, a settings file may include settings for multiple or for all components of a module. In still another embodiment, the module and/or components may be "connected" in that they are in communication with a communication network (e.g., the Internet) and settings can be loaded 320 to the components of the module via the network connection. The loaded 320 settings may further configure logical connections of the module according to a module definition and/or according to a configuration of the actual power system to be controlled by the control panel. Enabling configuration of the modules by loading settings enables a define module (e.g., a standard module) to be utilized in applications in operating a power system for a multitude of power system configurations.

Each module is designed and defined to be independently tested 322 to ensure proper operation. Testing may include testing to verify settings of each module. Testing may include current injection testing. The testing 322 can occur prior to installation in the control panel or following installation. Significantly, each module can be independently tested such that defects and/or errors are easily isolated to a module rather than being identifiable only as within the control panel, which can save significant time and expense in troubleshooting and finalizing a control panel for delivery and installation.

The modules are installed into a control panel rack to assemble 324 the control panel. The control panel assembly may be done prior to or after testing of the modules. Optionally, the control panel as a whole can be tested 326 for proper operation. As the modules are independently testable 322 and are designed and defined to operate independently and to present a defined interface to other modules and hardware of the electrical power system, testing 326 of the control panel as a whole may be a redundant and unnecessary action.

As mentioned, in certain embodiments, engineering 308 a forthcoming installation of a control panel occurs because a control panel is generally ordered or otherwise requested for a particular application pertaining to operation of an electrical power system at a particular location. Locations and applications are often unique, as previously explained, due to existing hardware and/or infrastructure, position on the grid, operator preferences and/or background or experience, and even factors such as climate and weather. Accordingly, additional engineering 308 and related services may be involved to eventually install and commission a control panel. Historically, lead times for installing and commissioning new control panels have been long, because each control panel was essentially built from scratch and the components for the control panel could not be identified until the engineering work was complete. The modules and modular assembly approaches and techniques described herein enable any additional engineering 308 to be done in parallel or otherwise concurrently with obtaining 316 components.

The engineering 308 of a forthcoming installation of a control panel, according to one embodiment of the present disclosure may include actions such as, but not limited to: obtaining module input data list(s), outage planning list(s), and commissioning plan and checklist(s); performing safety checks; conducting one or more site visits at the installation site; obtaining customer/requester drawings or renderings of one or more of: the installation site, an anticipated final rendering of the installation, and an interconnection of the control panel with other site hardware; developing an outage and commissioning plan; generating an engineering drawings package (e.g., using a design automation tool); transmitting the engineering drawings package(s) to the customer/requester; and obtaining approval of the engineering drawings from the customer/requester.

The engineering 308 of the forthcoming installation of the control panel may identify certain configuration adjustments or customizations to be made to components and/or modules of a control panel. The interconnection of the modules with other modules and with the power system apparatus may be unique or specific to a power system. Further customizations are done via settings that create logical connections internal to the IEDs that form the core of the module. A set of settings can be generated 310 that can be loaded 320 or otherwise applied to the components of assembled modules. The settings generated 310 may provide configuration of the components and/or the module, such as to select an option or setting made available by the component. For example, setpoints for functions associated with the forthcoming installation may be generated 310 and loaded 320 or otherwise applied to the components of assembled modules. As another example, logical connections for the component for functions associated with forthcoming installation may be generated 310 and loaded 320 or otherwise applied to the components of assembled modules. Nameplates and labels associated to the naming conventions used for the forthcoming installation may be generated 310 and loaded 320 or otherwise applied to the components of assembled modules.

The configurable settings of the components of the module allow customizing the module, and therefore the panel, to the requirements of the power system to be controlled. For example, there will be various teleprotection communications available and the module can be customized by programming to interface with what is available for this specific installation. The application may or may not require use of functions for manual and automatic control of power system breakers and switches and supervision of such functions (synchrocheck, dead voltage monitor, interlocking, etc). They may or may not require local and/or remote control and configuration to interface with various remote-control communications protocols. There are many variations that can be accommodated by engineering settings for the components (e.g., IEDs) that may form a core of the module. The generation 310 of settings may enable ongoing engineering 308 to occur in parallel or otherwise concurrently with the obtaining 316 of components and assembly 318 of the modules.

The control panel is installed 312 as ordered or according to any additional engineering. Once properly installed 312 at the location, the control panel can be put 314 into service or otherwise commissioned and made operational.

Figure 4:
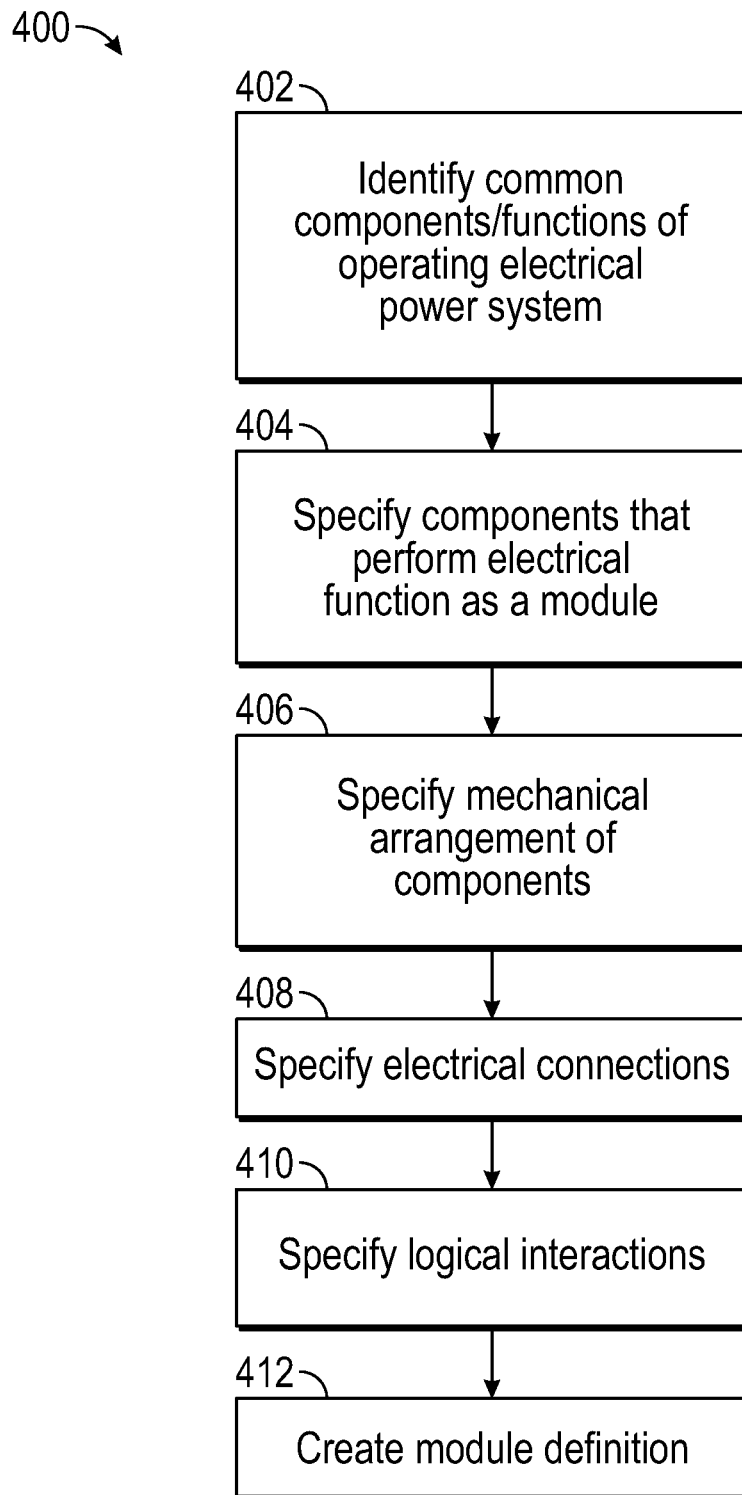
FIG. 4 is a flow diagram of a method of defining a module of a control panel, according to one embodiment of the present disclosure.

FIG. 4 is a flow diagram of a method 400 of defining a module of a control panel, according to one embodiment of the present disclosure. The method 400 of defining a module may be included as part of a method of assembling a control panel (e.g., see defining 302 modules of method 300 of assembling a control panel of FIG. 3).

A producer of control panels receives many orders or requests for control panels with certain components or functionality. Data can be gleaned from these orders to identify 402 common components and/or functions of operating an electrical system. Modules can be designed and defined based on these common components and/or functions.

In defining a module, a set of one or more components is specified 404 that can perform an intended electrical function of the module. The specified 404 set of one or more components may include IEDs, circuit breakers, jumpers, terminal blocks, and other electronic components. The specified 404 set of one or more components may further include wiring, cross braces, DIN rails (or terminal block rails), brackets, and/or screws and other mounting and/or assembly hardware. The components specified 404 as belonging in a module definition may depend on a level of detail desired or appropriate for the module definition. For instance, in some embodiments, literally every part of the module (e.g., down to screws, washers, wire ties, powder coat, and the like) may be specified 404. In other embodiments, merely the electronic components are specified 404 in the module definition and mounting and assembly components may simply be on hand as part of the assembly process. Still other embodiments may include electronic components and some mounting components (e.g., cross braces and rails).

The set of components are to be organized or otherwise arranged in the control panel according to a specified 406 mechanical arrangement. In defining a module, the mechanical arrangement is determined and specified 406. The module is designed such that the components fit within a control panel rack of standard size or dimensions. The mechanical arrangement specifies positioning of the components so that the module fits within the space allotted within the control panel rack and its corresponding dimensions. Further, the electronic components may have space requirements, such as to allow airflow for cooling, to avoid arcing, and the like, and the mechanical arrangement is specified 406 to position the components to comply with these requirements.

Electrical connections of the module are also to be specified 408 in a module definition. The components are electrically interconnected, such as by wiring, pins, jumpers, and the like, to accomplish the function of the module. In defining a module, the electrical connections between the components and at interfaces of the module to connect with other modules and hardware of the electrical power system are determined and specified 408. The electrical connections may be specified 408 by an indication of which connector of a component is to be connected to which connector of another component and by what connection medium (e.g., a wire having given specifications). The electrical connections may be specified 408 to ensure that a connection medium is rated for the anticipated current and/or voltage of electricity to be passed therethrough.

Logical interactions of the module are to be specified 410 in a module definition. Not only are components of the module electrically connected, the meaning of the electrical signals can be determined to clarify the interconnection and interoperability of the components to accomplish the intended function of the module. In defining a module definition, the logical interactions, including connections between components and at logical interfaces with other modules or other equipment of the power system are determined and specified 410. The logical interactions may be specified according to an indication of a logical meaning of a signal on a connector of a component as provided over a connection medium to another connector of another component. The logical interactions may be specified 410 to ensure logical understanding within each module and at interfaces of the module to other modules and other equipment. The logical interactions may also be specified 410 so as to provide a meaningful mode to test that the module operates properly when assembled.

With the components identified 402 and specified 404 to perform an intended electrical function of a module, and with the mechanical arrangement specified 406, the electrical connections specified 408, and the logical interactions specified 410, a module definition can be created 412 or otherwise put into a useful and usable form. For example, the module definitions may be created 412 on a computing system and stored in a memory or other computer readable storage medium. The created 412 module definitions can then be utilized, such as by a computing system, an engineering team, an electrical power system operator, or the like, to present a designation of components for a module. Similarly, the created 412 module definitions can be utilized by a computing system, an engineering team, a third-party original equipment manufacturer (OEM), and/or a purchase and/or a manufacturing team to generate a BoM at or near the outset of a module being ordered or otherwise requested.

Figure 5:
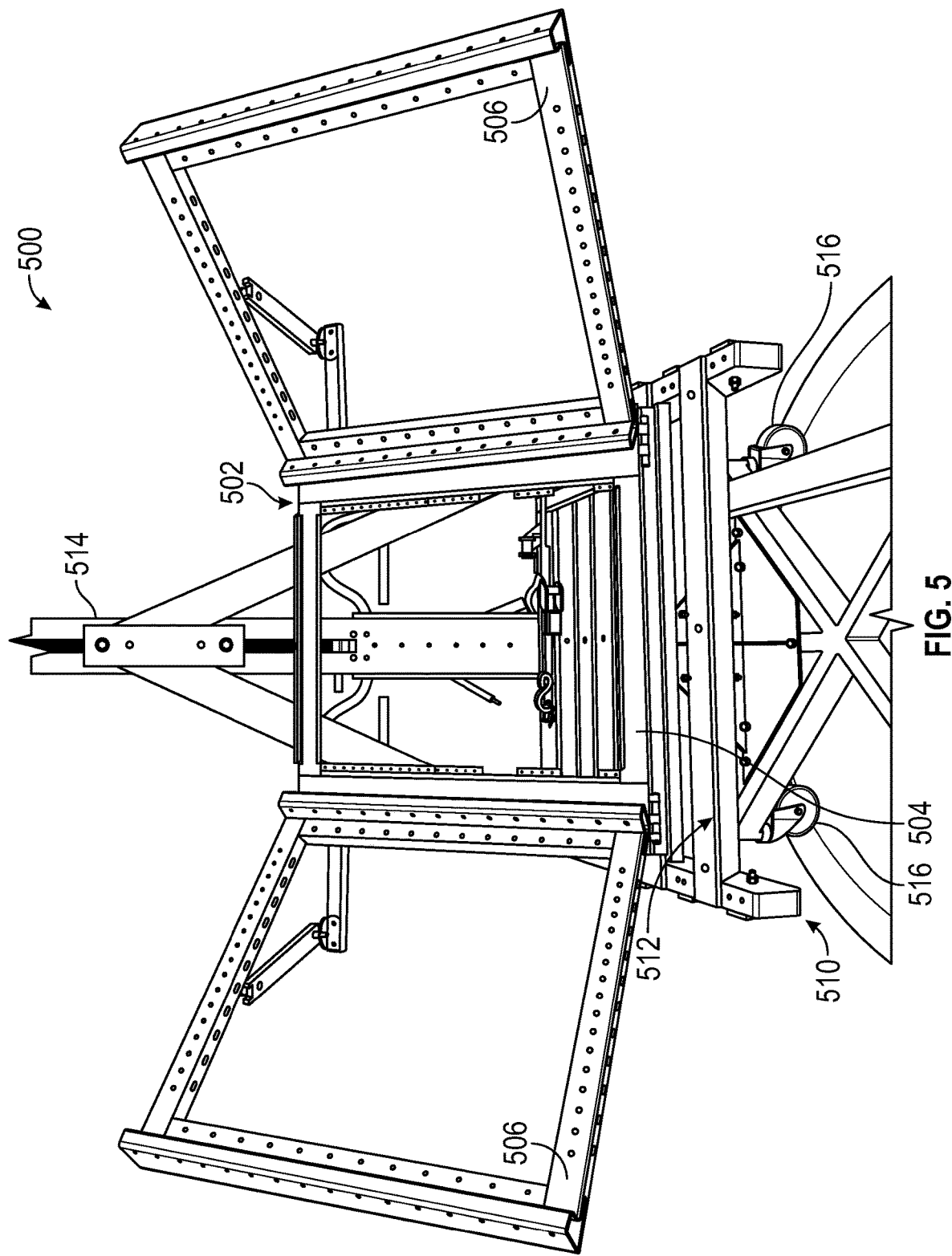
FIG. 5 is a back view of an assembly station, according to one embodiment of the present disclosure, having an assembly frame in a reclined position.

FIG. 5 is a back view of an assembly station 500, according to one embodiment of the present disclosure. The assembly station 500 provides an environment and/or workspace for independent assembly and testing of a module, according to embodiments of the present disclosure. In FIG. 5, the assembly station 500 includes an assembly frame 502 that is shown in a reclined position. The assembly frame 502 provides structure for temporary installation of module components during independent assembly of a module of a control panel.

The assembly frame 502 includes a faceplate frame 504 and side frames 506. The faceplate frame 504 is to accept and support a faceplate of a module to orient a front of the faceplate forward (and optionally downward) and a back of the face plate rearward (and optionally upward) for ease of viewing and access by a user during assembly of a module. A face plate may be temporarily mounted on a forward side of the faceplate frame 504, in some embodiments, to be supported during assembly of a module. In other embodiments, a face plate may be mounted on a rearward side of the faceplate frame 504 for greater convenience and/or accessibility in temporarily mounting the faceplate to the faceplate frame 504. The faceplate frame 504 includes mounting features to which the faceplate of the of the module is to be temporarily mounted.

The side frames 506 each extend rearward from the faceplate frame 504 on opposing lateral sides of the faceplate frame 504. The side frames 506 are pivotably mounted, or otherwise moveably coupled, to the faceplate frame 504 to be rotatable between a narrow position and an open position. In FIG. 5, the side frames 506 are shown in an open position, angling away from each other to provide a technician or other user increased access to components mounted to the side frames 506 and/or the faceplate frame 504.

A first side frame 506 may be pivotably (or otherwise moveably) coupled to a first lateral side of the faceplate frame 504 and rotatable between a first (e.g., narrow) position that is in a plane substantially perpendicular to a plane of the faceplate frame 504 and a second (e.g., open) position, which is shown in FIG. 5, that is in a plane at an angle greater than 90 degrees to a plane of the faceplate frame 504. The first side frame 506 extends rearward from the faceplate frame 504 in the first position and in the second position to provide accessibility to the user during assembly of a module. The first side frame 506 includes mounting features for temporarily mounting a first cross brace to support components of the module during assembly of a module (e.g., wiring components mounted to the mounting bracket to components mounted to the faceplate) and after permanent mounting of the cross brace during installation of the module into a control panel.

A second side frame 506 is coupled to the faceplate frame 504 at a second lateral side that is opposite the first lateral side of the faceplate frame 504 and the first side frame 506. The second side frame 506 also extends rearward from the faceplate frame 504 to provide accessibility to module components for the user during assembly of a module. The second side frame 506 may include mounting features for temporarily mounting a second cross brace to support components of the module during assembly of a module and after permanent mounting of the second cross brace during installation of the module into a control panel.

The assembly frame 502 may be installed on an adjustable workstation 510 with a horizontal work surface 512 and a lift 514 to adjust a height of the work surface 512. The assembly frame 502 may be pivotably mounted or otherwise moveably coupled to the work surface 512 such that a working angle of the assembly frame 502 may be adjusted between an upright position and a reclined position. The assembly frame 502 is shown in a reclined position in FIG. 5. The adjustable workstation 510 may be on wheels 516 for ease of transport or movement of the assembly frame 502 in a manufacturing environment.

The assembly frame 502 may be scaled to a dimension of a module of a control panel. The module may include components for performing a function or for a feature of the module. For example, a feeder protection module may include a feeder protection IED for mounting into the face plate, associated DIN rails, wiring, test switches, and the like. The feeder protection module may be assembled in the assembly frame 502 by installation (albeit temporary) of the face plate into the faceplate frame 504; installation of the feeder protection IED and associated test switches into the faceplate; installation of brackets onto the side frames 506; installation of the associated DIN rails, terminal blocks, circuit breakers, and the like onto the brackets; and the associated wiring of the various components as designed. Installation of the feeder protection module into a control panel frame may then be performed by transporting the feeder protection module that has been temporarily assembled into the assembly frame 502 to the control panel frame. The faceplate (that includes the feeder protection IED and test switches) and the brackets (including wiring) may then be removed from the assembly frame 502 and installed into the control panel frame.

Figure 6:
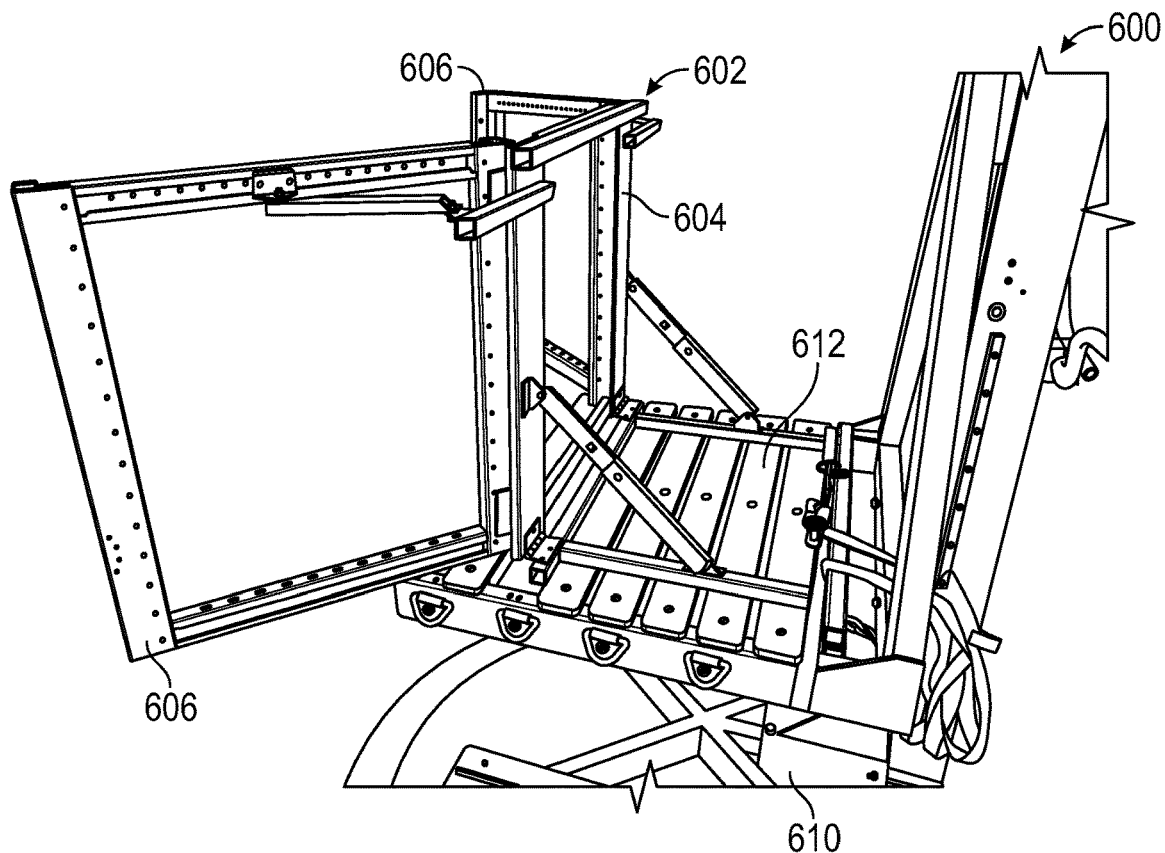
FIG. 6 is a side perspective view of an assembly station, according to one embodiment of the present disclosure, having an assembly frame in an upright position.
Figure 7:
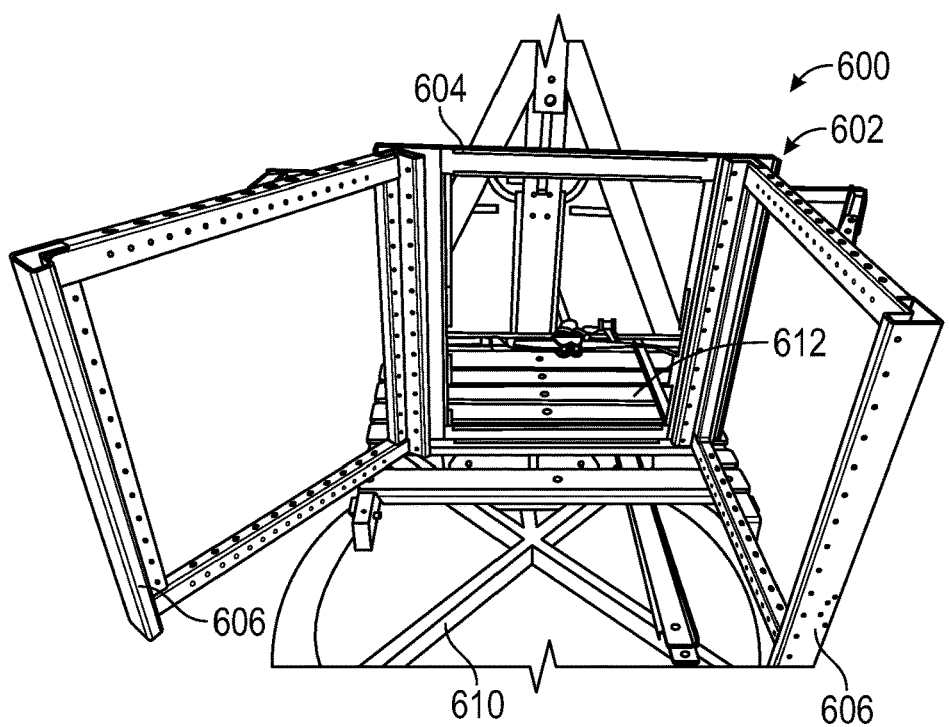
FIG. 7 is a back top view of an assembly station, according to one embodiment of the present disclosure, having one side frame in an open position and one side frame in a narrow position.
Figure 8:
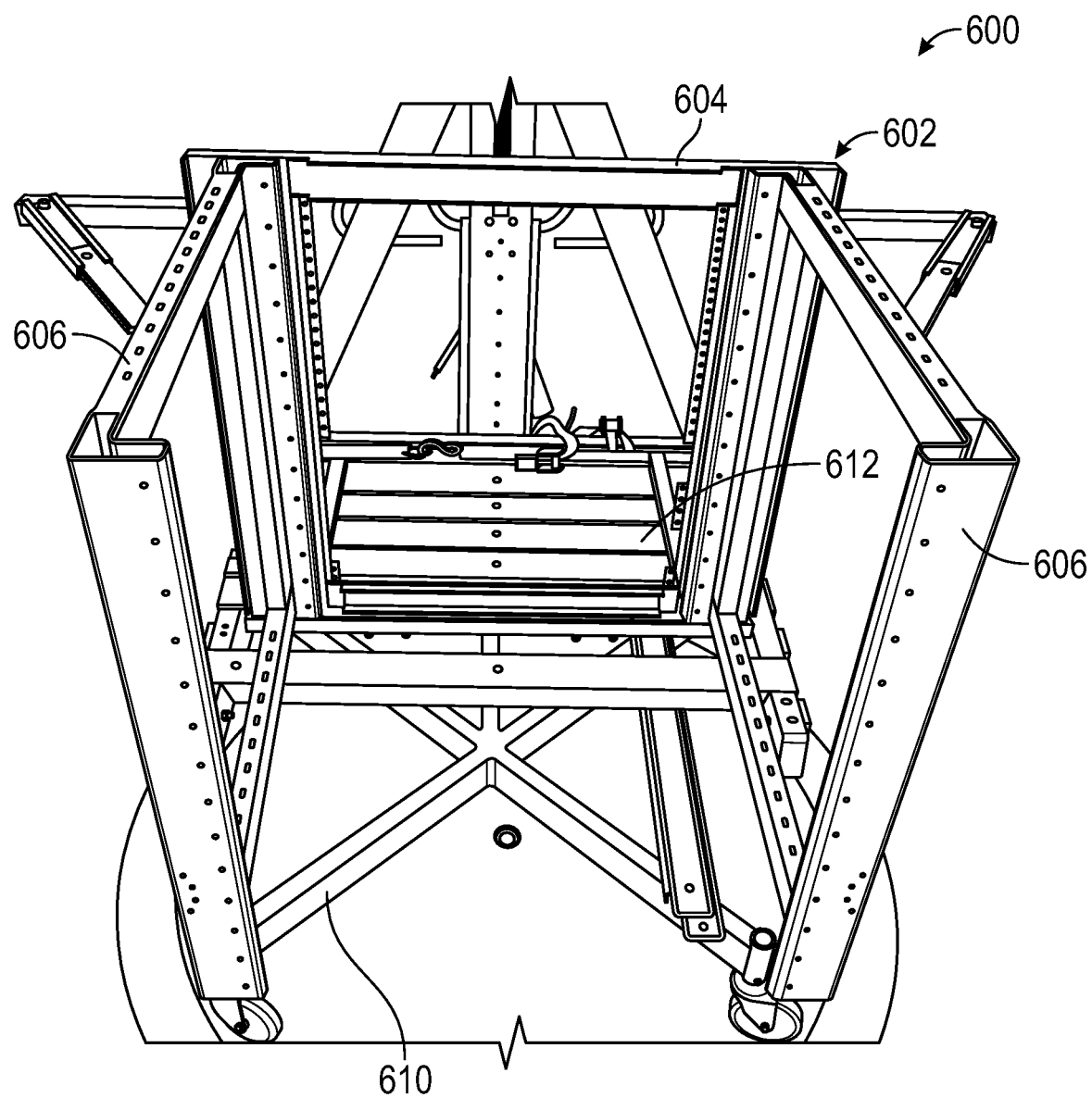
FIG. 8 is a back top view of an assembly station, according to one embodiment of the present disclosure, having both side frames in a narrow position.

FIGS. 6, 7, and 8 are different views of an assembly station 600, according to one embodiment of the present disclosure, with an assembly frame 602 mounted on a work surface 612 of an adjustable workstation 610. FIG. 6 is a side perspective view of the assembly station 600 with the assembly frame 602 in an upright position. FIG. 7 is a back top view of the assembly station 600 with one side frame 606 in an open position and one side frame 606 in a narrow position. FIG. 8 is a back top view of the assembly station 600 having both side frames 606 in a narrow position. As can be seen, an angle between side frames 606 and a faceplate frame 604 of the assembly frame 602 may be adjusted for convenience of assembly. Further, it may be seen that an angle between the faceplate frame 604 and the work surface 612 of the adjustable workstation 610 may be adjusted between an upright position and a reclined position for ease of assembly.

Figure 9:
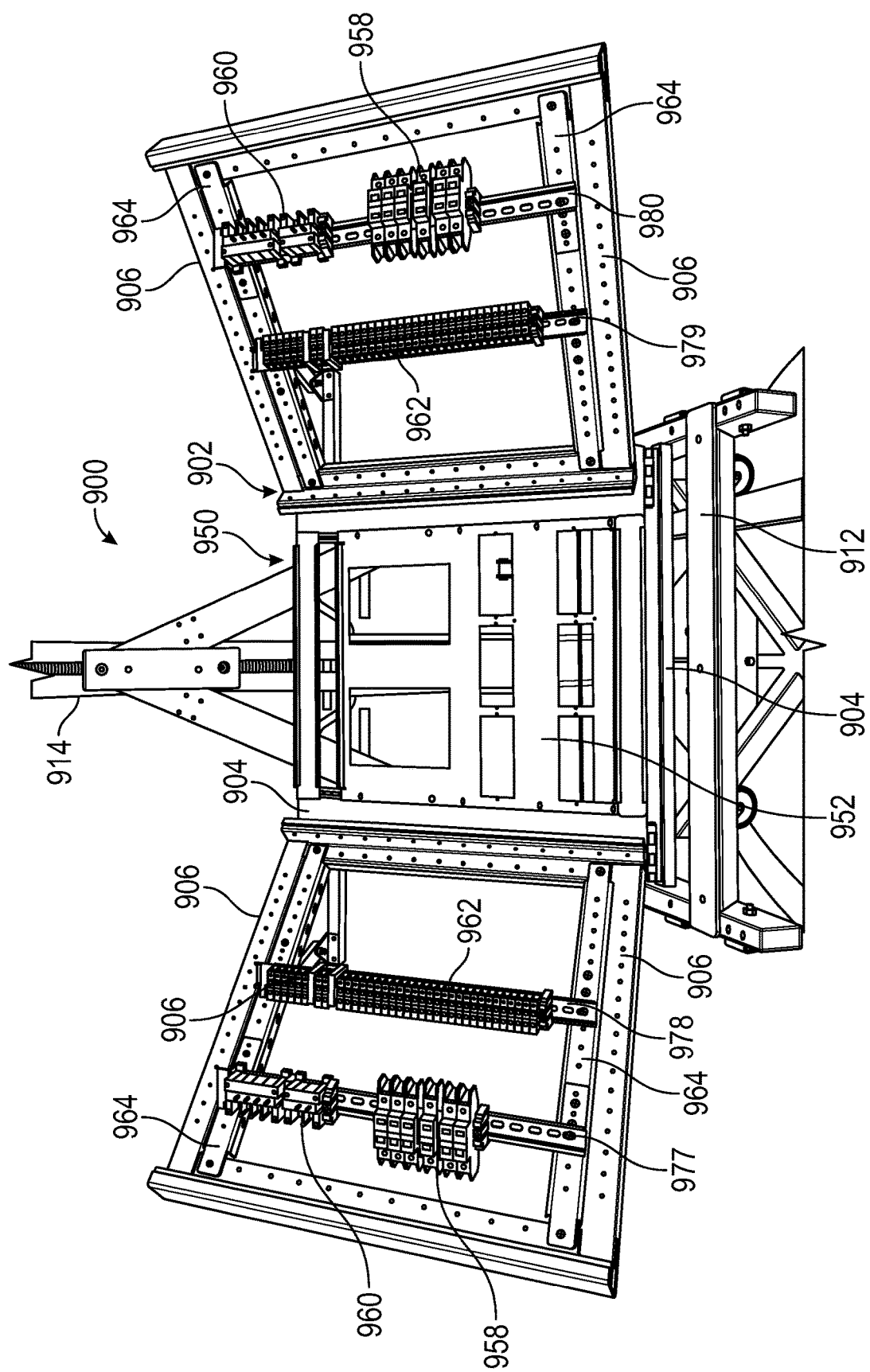
FIG. 9 is a back view of an assembly station, according to one embodiment of the present disclosure, having the assembly frame in a reclined position and both side frames in an open position and components of a module mounted thereto during module assembly.
Figure 10:
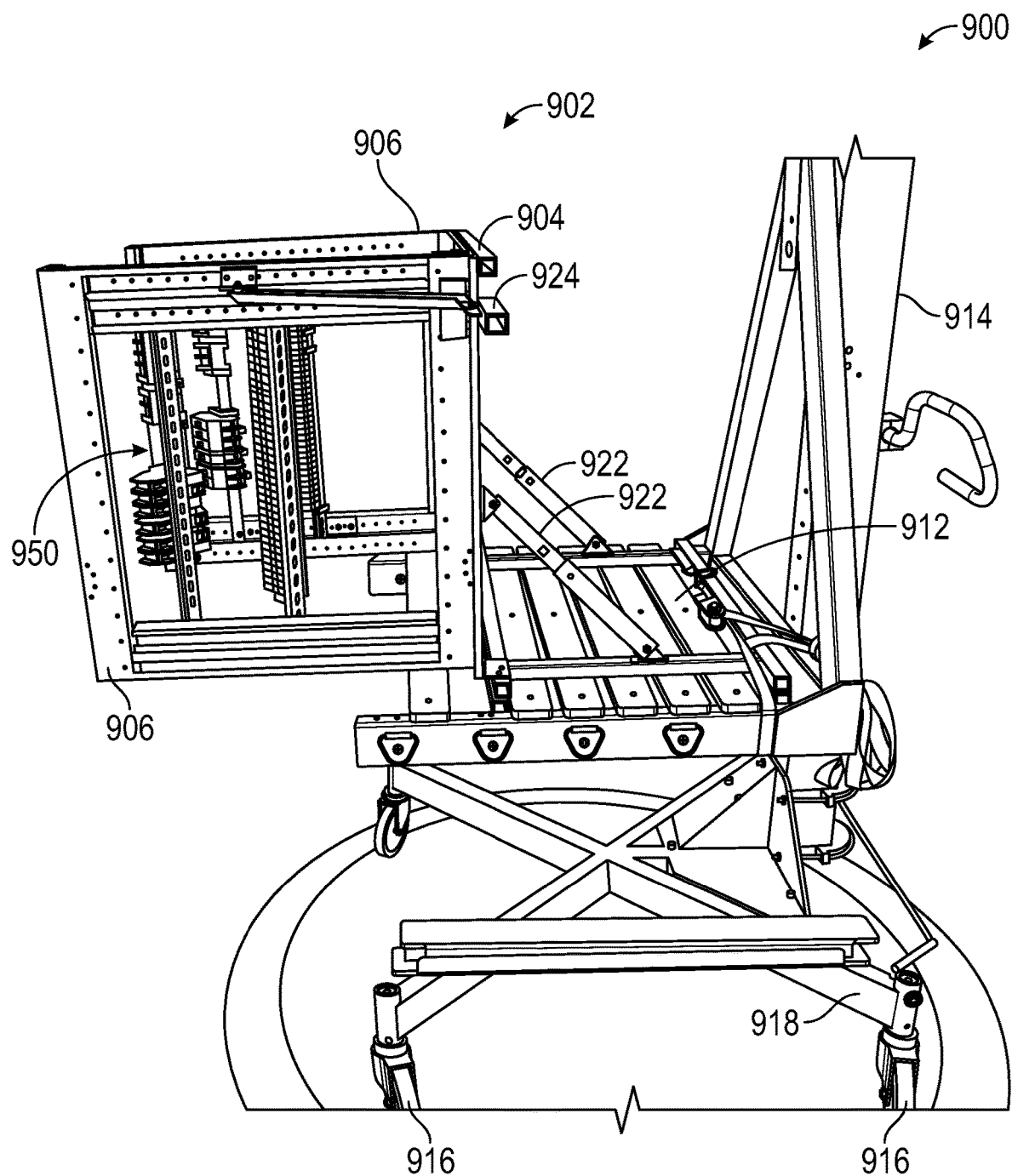
FIG. 10 is a side view of an assembly station, according to one embodiment of the present disclosure, having the assembly frame in an upright position and both side frames in a narrow position and components of a module mounted thereto during module assembly.

FIGS. 9 and 10 are views of an assembly station 900, according to one embodiment of the present disclosure. An assembly frame 902 of the assembly station 900 is in an open and reclined position. In FIG. 9, the assembly frame 902 includes a faceplate frame 904 in a reclined position and a pair of side frames 906, both in an open position for ease of assembly. The assembly station 900 is shown during assembly of a module with components of a module temporarily mounted to the frames 904, 906 for assembly.

FIG. 9 is a back view of the assembly station 900 with the assembly frame 902 in the reclined position and both side frames 906 in an open position and components of the module 950 are mounted thereto during module assembly. A faceplate 952 is mounted to the faceplate frame 904 with a rear surface of the faceplate frame 904 oriented rearward to be accessible to a technician, engineer, or other user of the assembly station 900. Cross braces 964 of a module being assembled are temporarily mounted to the side frames 906. DIN rails (or terminal block rails) 977, 978, 979, 980 are mounted to the cross braces 964. Additional module components, including circuit breakers 958 and terminal blocks 960, 962 are mounted to the DIN rails (or terminal block rails) 977, 978, 979, 980. The assembly station 900 provides a user increased space and access to the faceplate 952, cross braces 964, and DIN rails (or terminal block rails) 977, 978, 979, 980 for installing components of a module, and further provides the user increased space and access to the components for wiring electrical connections. A height of a work surface 912 can be adjusted by a lift 914 to improve the ergonomic position of the assembly frame 902 for a user.

FIG. 10 is a side view of the assembly station 900 with the assembly frame 902 in an upright position and both side frames 906 in a narrow position and components of a module are mounted thereto during assembly of the module 950. FIG. 10 illustrates vertical stabilizers 922 to stabilize the assembly frame 902 in the upright position and to accommodate the assembly frame 902 in the reclined position. In the embodiment of FIG. 10, the vertical stabilizers are coupled to the faceplate frame 904. In other embodiments the vertical stabilizers can be coupled to other portions of the assembly frame 902. The vertical stabilizers also couple to the work surface 912. FIG. 10 also illustrates lateral stabilizers 924 to stabilize the side frames 906 in the narrow position and in the open position(s). A lift 914 can adjust a height of the work surface 912. The assembly station 900 also includes a cart 918 on wheels 916 to provide movability of the assembly station 900.

Figure 11:
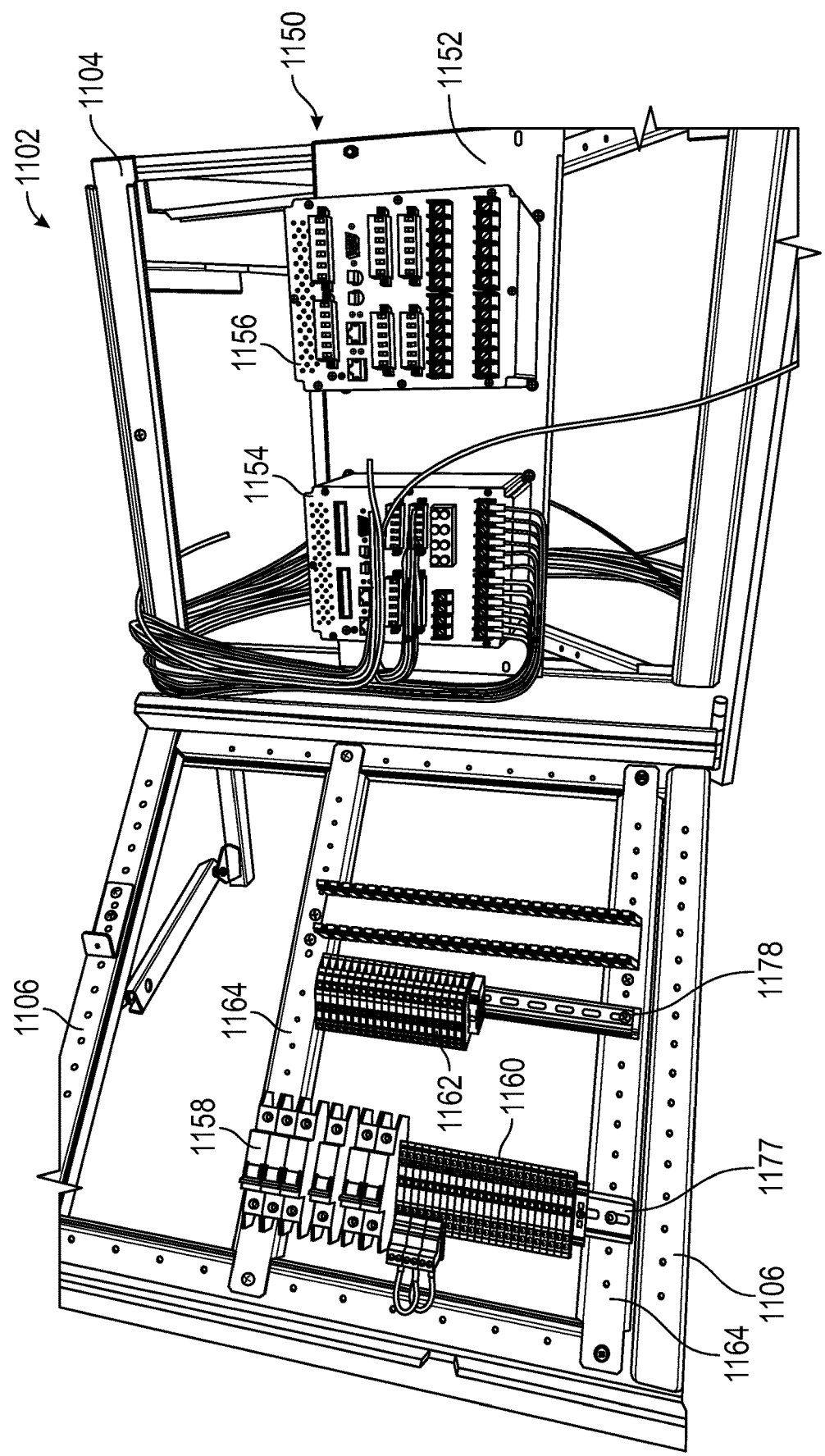
FIG. 11 is a partial perspective view of an assembly frame, according to one embodiment of the present disclosure, with various components temporarily mounted thereon.

FIG. 11 is a partial perspective view of an assembly frame 1102, according to one embodiment of the present disclosure, with various components of a module 1150 temporarily mounted thereon. As can be seen, IEDs 1154 and 1156 have been mounted into the faceplate, which is temporarily installed in the faceplate frame. Cross braces 1164 are temporarily mounted in the side frame 1106 and rails 1177, 1178 are mounted to the cross braces 1164. Components of the module 1150, including circuit breakers 1158 and terminal blocks 1160, 1162, are mounted to the rails 1177, 1178. The side frame 1106 is in an open position angled rearward and laterally from the faceplate frame 1104 to provide additional space and access to the components for wiring and otherwise assembling the module 1150. Wiring from IED 1154 has been partially installed, to be coupled to other components of the module 1150.

Figure 12:
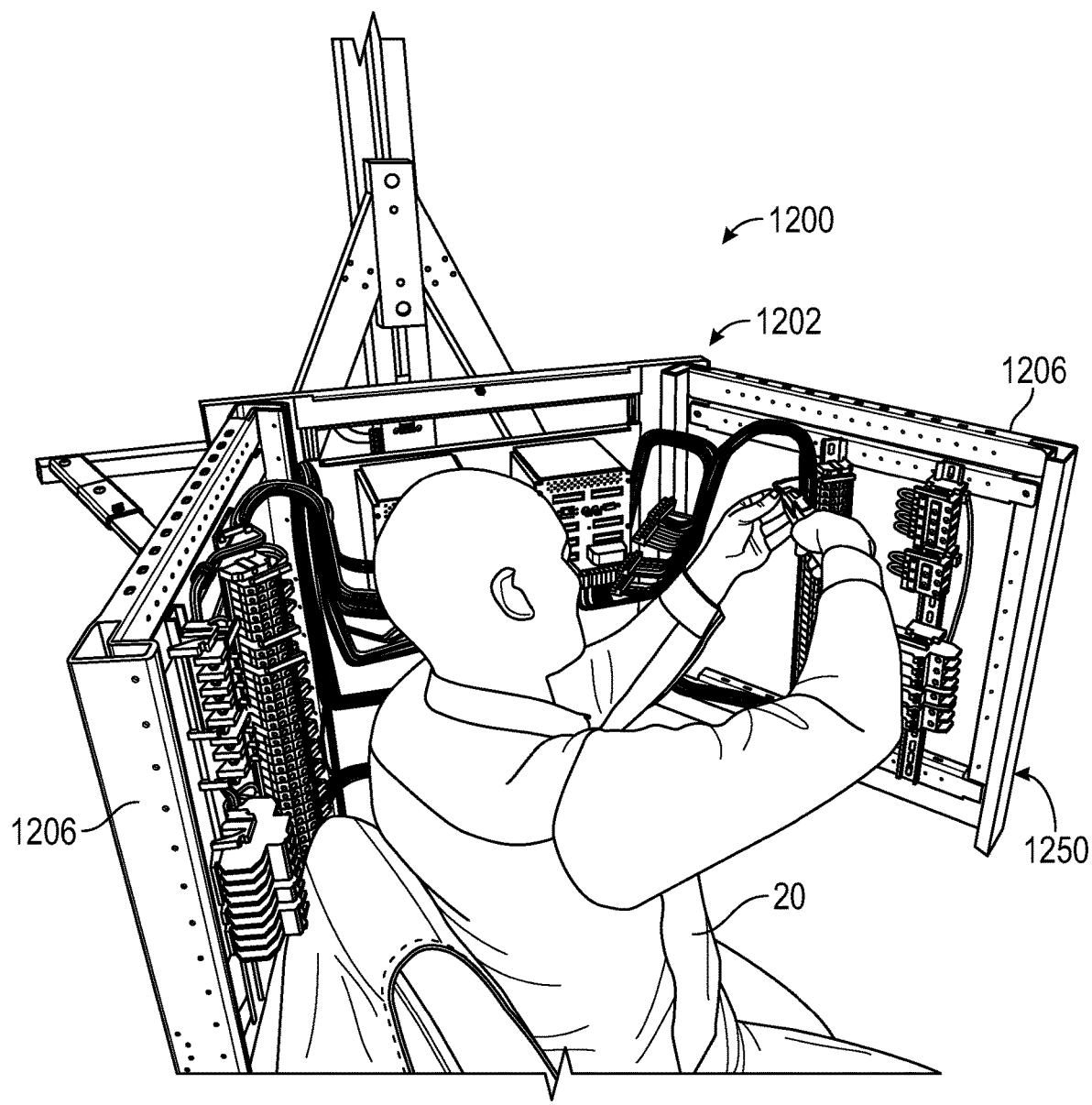
FIG. 12 is a perspective rear view of an assembly station, according to one embodiment of the present disclosure, and illustrates a technician wiring various components of a module that are temporarily mounted on the assembly frame.

FIG. 12 is a perspective back view of an assembly station 1200, according to one embodiment of the present disclosure, and illustrates a technician 20 wiring various components of a module 1250 that are temporarily mounted on the assembly frame 1202. The side frames 1206 are adjusted to an open position to afford easier access to the various components of the module 1250 during assembly (e.g., installation and wiring) of the components. The height of the assembly frame 1202 is adjusted to allow the technician 20 to be seated while assembling the module 1250.

Figure 13:
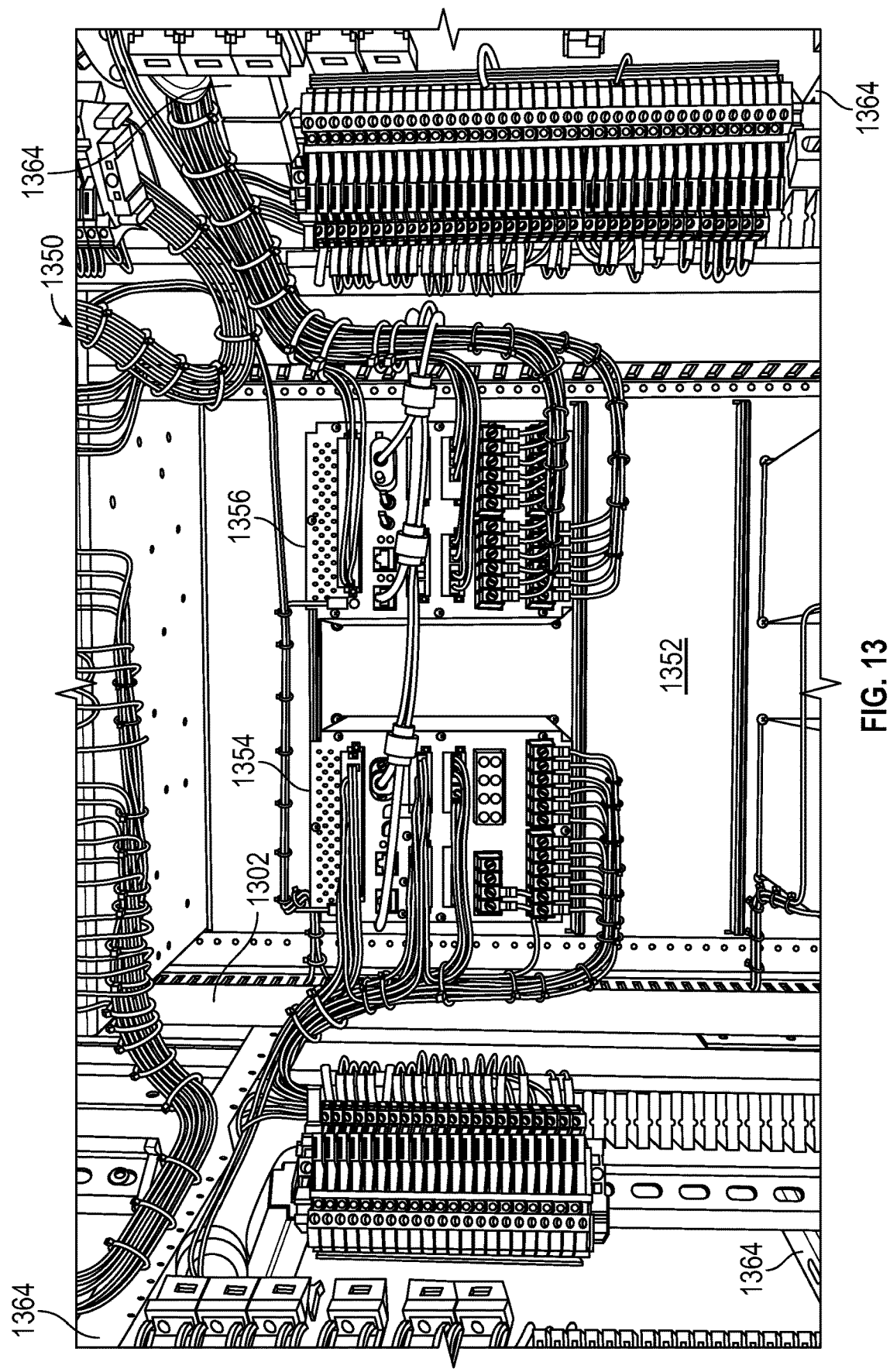
FIG. 13 is a rear elevation view of a back of a module installed into a control panel, according to one embodiment of the present disclosure.

FIG. 13 is a rear or back elevation view of a back of a module 1350 installed into a control panel, according to one embodiment of the present disclosure. The control module 1350 is shown after assembly onto an assembly frame, and after removal from the assembly frame and permanent installation into a control panel frame 1302. As has been stated above, the installation into the control pane frame 1302 may be performed by removal of the faceplate 1352 and cross braces 1364 from the assembly frame, and installation of the faceplate 1352 and cross braces 1364 into the control panel frame 1302. Whereas previously all installation, assembly, and wiring was performed directly in the control panel frame, the embodiments of the present disclosure allow for assembly and wiring of the various components of the module 1350 in an assembly frame, and then the remaining work that is done within the control panel frame 1302 is the installation of the assembled module 1350 into the control panel frame 1302. The assembly frame can then be re-used for assembly of additional modules. Furthermore, multiple modules may be assembled in parallel in multiple assembly frames, and each installed into the control panel frame 1302 to produce a control panel. The modules may be similar or different. The modules may be wired together once installed in the control panel frame 1302.

Figure 14:
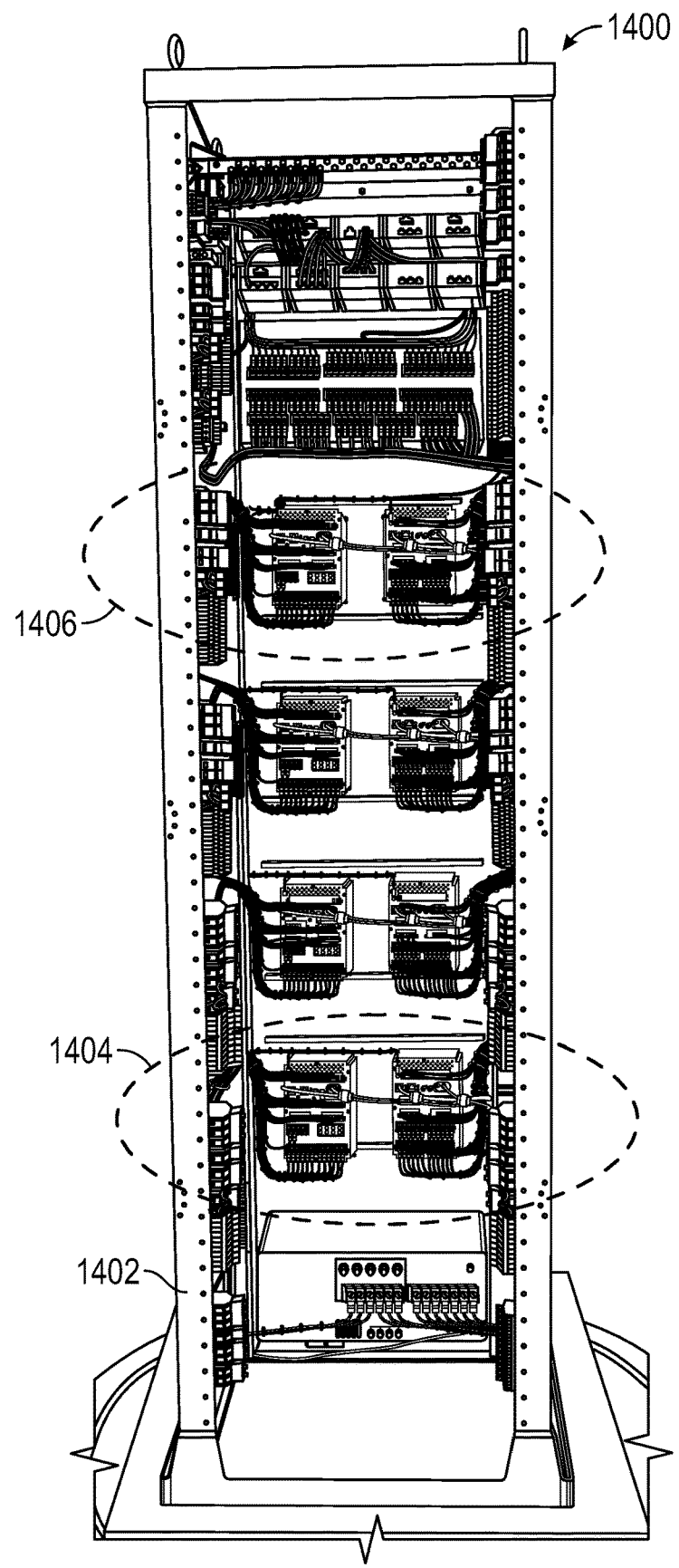
FIG. 14 is a rear elevation view of a control panel with several modules, according to one embodiment of the present disclosure.
Figure 15:
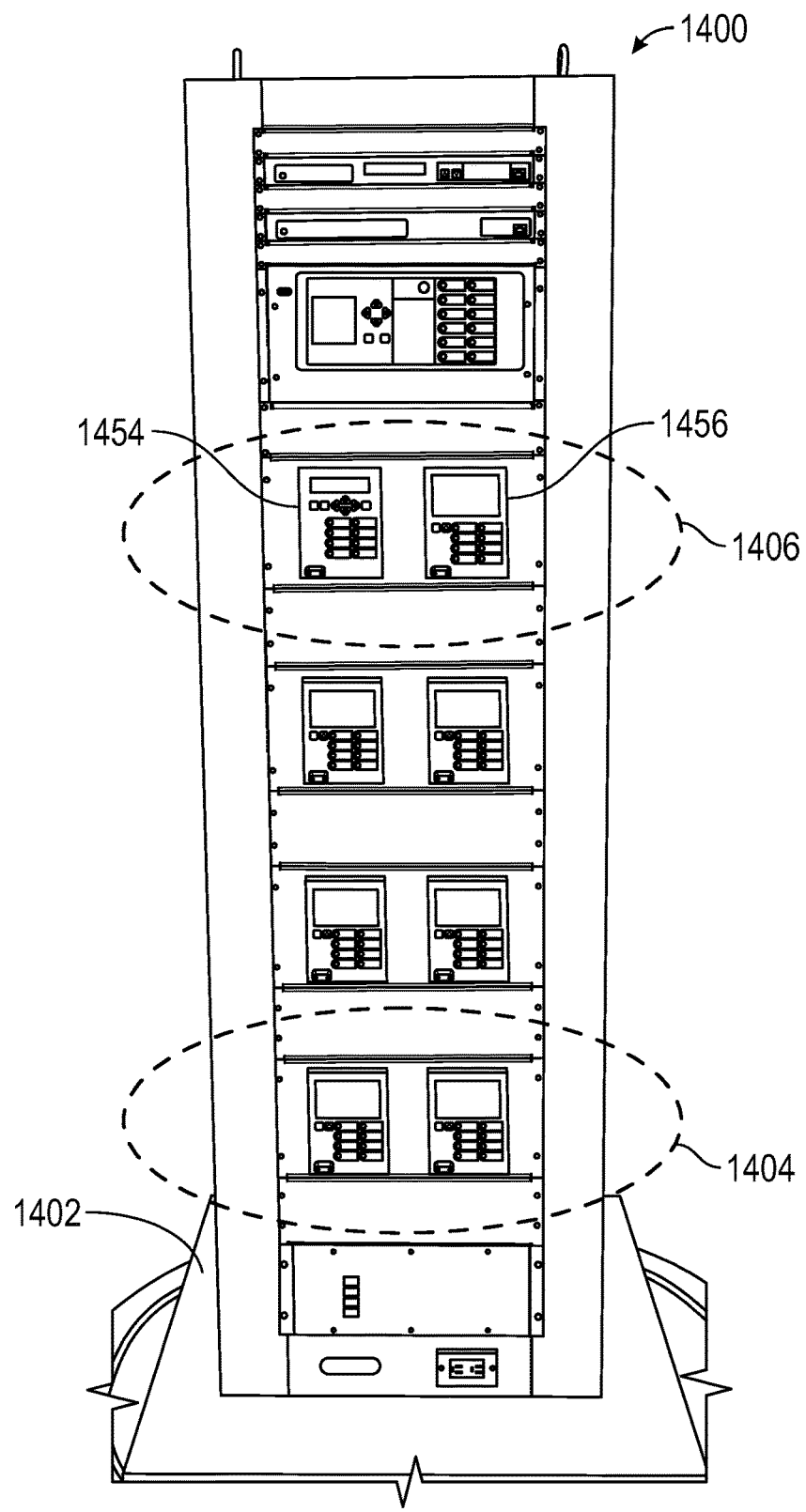
FIG. 15 is a front elevation view of a control panel, according to one embodiment of the present disclosure.

FIGS. 14 and 15 illustrate back and front views of a modularly assembled control panel 1400, including a control panel frame 1402 with various modules 1404, 1406 that have been assembled and wired in assembly frames, and then installed into the control panel frame 1402 to produce a control panel. FIG. 14 is a back elevation view of the control panel 1400 illustrating the several modules 1404, 1406 wired together with wires extending within the interior of the control panel frame 1402. FIG. 15 is a front elevation view of the control panel 1400, with user interfaceable components 1454, 1456 (e.g., IEDs) presented for user interfacing. As can be seen, the separate modules 1404, 1406 may be easily removed and reinstalled during repair or upgrade. The various methods and devices described herein may be used to produce modularly assembled control panels. That is, the control panels of the present disclosure may be made up of control panel modules that have been assembled and wired using assembly frames, and installed into a control panel frame in a modular configuration. Accordingly, the control panel is comprised of a control panel frame 1402 and separately assembled control modules 1404, 1406. The separately assembled control modules 1404, 1406 may be separately removed and reinstalled during repair or upgrade procedures.

Figure 16:
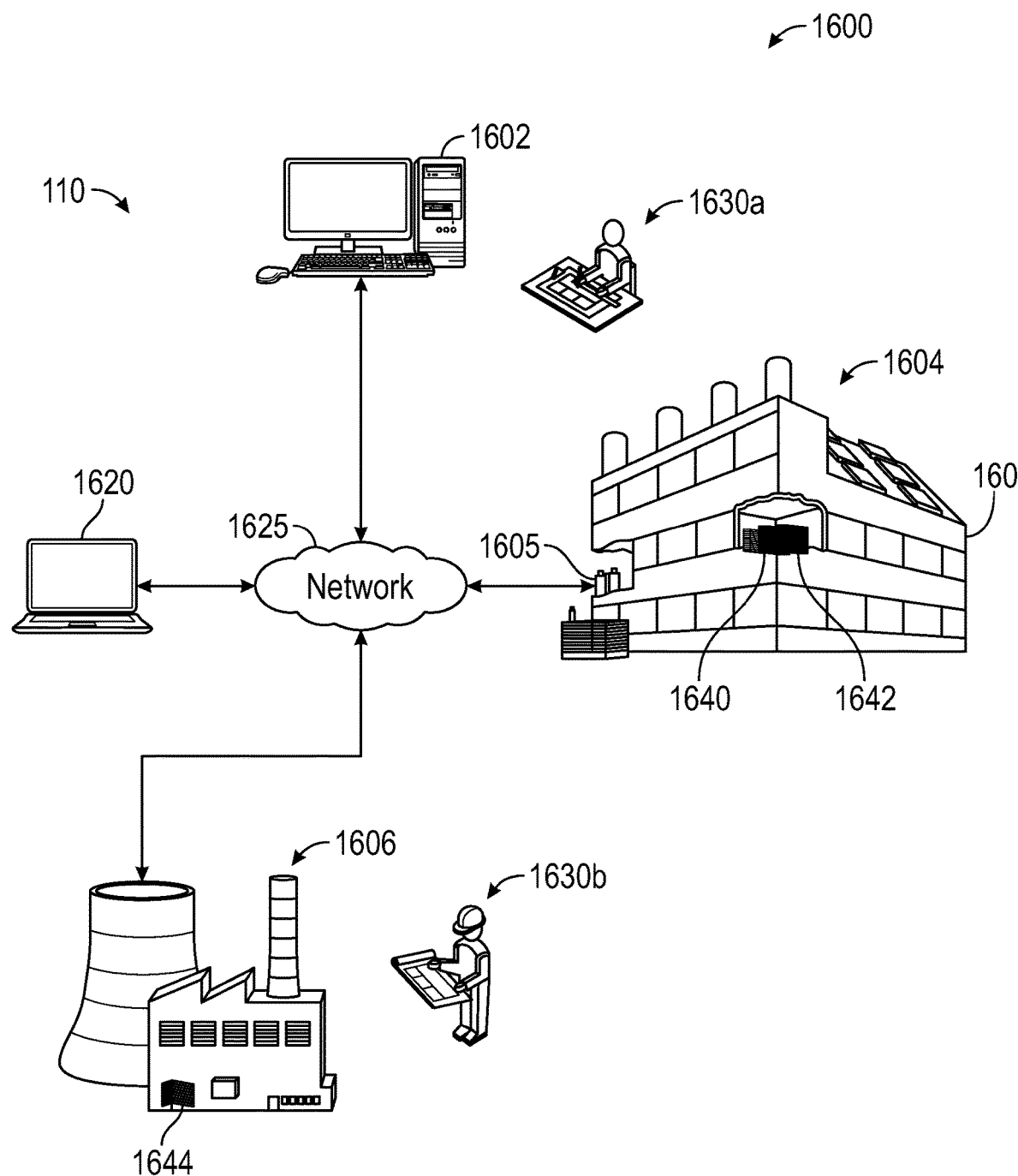
FIG. 16 is a diagram of a control panel assembly system, according to one embodiment of the present disclosure.

FIG. 16 is a diagram of a control panel assembly system 1600, according to one embodiment of the present disclosure. A control panel assembly computing system 1602, a manufacturing facility 1604, a control panel installation site 1606 (e.g., an electrical power plant), and, optionally, a client computing device 1620 may be coupled together via a communication network 1625. Modules are defined, such as on the control panel assembly computing system 1602, at the client computing device 1620, and/or by an engineering team at the manufacturing facility 1604. Module definitions are stored at or accessible to the control panel assembly computing system 1602.

A control panel order may be received at the control panel assembly computing system 1602. The control panel order may be received from an installation site 1606 or from the client computing device 1620 and may be received over the communication network 1625. In some embodiments, the client computing device 1620 can be co-located at the installation site 1606. The control panel order includes a designation of a set of modules to be included in a control panel to be assembled. Each module of the set of modules is selected from the plurality of modules defined. Alternatively, instead of a control panel order, simply a designation of the set of modules may be received.

To aid in designation of a set of modules, a module selection interface (e.g., a graphical user interface) may be presented to a user (e.g., technician, engineer, operator) on the client computing device 1620. The module selection interface may provide for selection at a modular level, such that the user selects modules for inclusion into a control panel. Generally such a selection process or option would be presented only to qualified users with knowledge about compatibility of modules and/or control panel definitions and the modules specified in such control panel definitions. Alternatively, a "wizard" or guided process may guide a user in selection of modules. The module selection interface and/or the control panel assembly computing system 1602 may present options for selecting modules according to compatibility constraints (e.g., rules or guidelines) directing which defined modules are compatible in a control panel. The compatibility constraints may be configured according to complementary functionality of modules, standard practices in the industry, best practices, and/or laws of electricity, physics, and/or other science. For example, the compatibility constraints may provide that a module for line protection should not be used for transformer protection, because standard industry practice is to avert combining control of separate major components of an electrical power system within a single control panel (e.g., because a repair of such control panel or component being controlled by such control panel would require taking two major components offline for the single repair). The compatibility constraints aid in removing module designation options (e.g., on the module selection interface) for modules that are not associated with an intended application or complementary to that application.

In another embodiment, the module selection interface may provide for selection of a control panel to be configured according to a customized application. The module selection interface may provide predetermined packages (e.g., similar to a template control panel) directed to certain applications (e.g., generic or common applications), and then provide options for customizing one or more components within such packages. For example, an application may be to monitor, control, and operate an additional switching device in the power system. Customization of a previously defined control panel via the selection interface can repurpose interface points, electrical connections and/or digital connections to achieve the desired functionality.

The customization is generally accommodated by selecting the modules. For example, if the application requires a certain type of local control interface, the correct control module that provides the required interface can be included in the control panel. There may be certain repurposing of wiring depending on the combination of modules selected. For example, if a breaker control module is required to provide breaker failure protection, outputs for breaker failure trip in a module get repurposed for breaker failure initiate. The module design such that complete repurposing of wiring to accommodate unanticipated variations is not required. Any customization of the system is accomplished by merely connecting external wires and in customizing settings.

In still another embodiment, the module selection interface may in fact provide for selection of stock control panels. A selection of a stock control panel corresponds to a designation of a set of modules that can be ordered either to build the requested control panel or to build a replacement of a control panel pulled from stock. Stated differently, the module selection interface may provide for selection of a control panel without any customization to the modules included therein.

The module definitions, as described above, afford an ability for the control panel assembly computing system 1602 to automatically generate or otherwise prepare a BoM for a designated set of modules. The BoM can be communicated to a computing system 1605 of the manufacturing facility 1604, for example over the communication network 1625. In some embodiments, the control panel assembly computing system 1602 can be co-located with the manufacturing facility 1604.

The manufacturing facility 1604 can immediately begin manufacturing of and/or a process of procuring components of the modules according to a parts list of the BoM. Additional engineering 1630a, 1630b by the producer of the panels and/or at the installation site 1606 can be ongoing while the manufacturing facility 1604 is producing/procuring components of the modules. The additional engineering 1630a, 1630b, according to some embodiments, may include any one or more of: obtaining module input data list(s), outage planning list(s), and commissioning plan and checklist(s); performing safety checks; conducting one or more site visits at the installation site 1606; obtaining customer/requester drawings (or renderings) of one or more of: the installation site, an anticipated final rendering of the installation, and an interconnection of the control panel with other site hardware; developing an outage and commissioning plan; generating an engineering drawings package, for example, using a design automation tool; transmitting the engineering drawings package(s) to the customer; and obtaining approval of the engineering drawings from the customer. As can be appreciated, the additional engineering involved may vary depending on whether the project is a greenfield (new) project or a brownfield (retrofit/upgrade) project.

The designated set of modules can be assembled at the manufacturing facility 1604 using assembly frames 1640 as described above, according to the module definitions. Assembling the designated set of modules on the assembly frames 1640 may include wiring according to a corresponding module definition and the data therein specifying electrical connections between the one or more components. Assembling the designated set of modules can include arranging the components according to the data specifying the mechanical interaction. Assembling the designated set of modules may include loading settings for components of the module.

The modules may be independently tested for proper functioning at the manufacturing facility 1604 or by an engineering person/team at the installation site. The independent testing of the modules can occur prior to or after assembly of the set of modules into a control panel.

With the modules assembled, the requested control panel can be assembled in a control panel rack 1642 at the manufacturing facility or a rack at the installation site 1606. The completed control panel is then installed or otherwise connected to electrical power system hardware and/or other equipment and then put into commission. Installing the control panel can include one or more of: mobilizing for construction; verifying and performing a safety plan; implementing an isolation plan (switching orders); implementing a demolition plan (including panel cuts); installing and wiring the control panel to one or more of adjacent hardware and the electrical system (using checklists); performing functional tests on the control panel; putting an associated zone of the electrical power system into service per switching orders; and updating the engineering drawings package to reflect changes made during installation to produce a final engineering drawings package that documents the control panel as-installed. As can be appreciated, the installation process may vary depending on whether the project is a greenfield (new) project or a brownfield (retrofit/upgrade) project.

Figure 17:
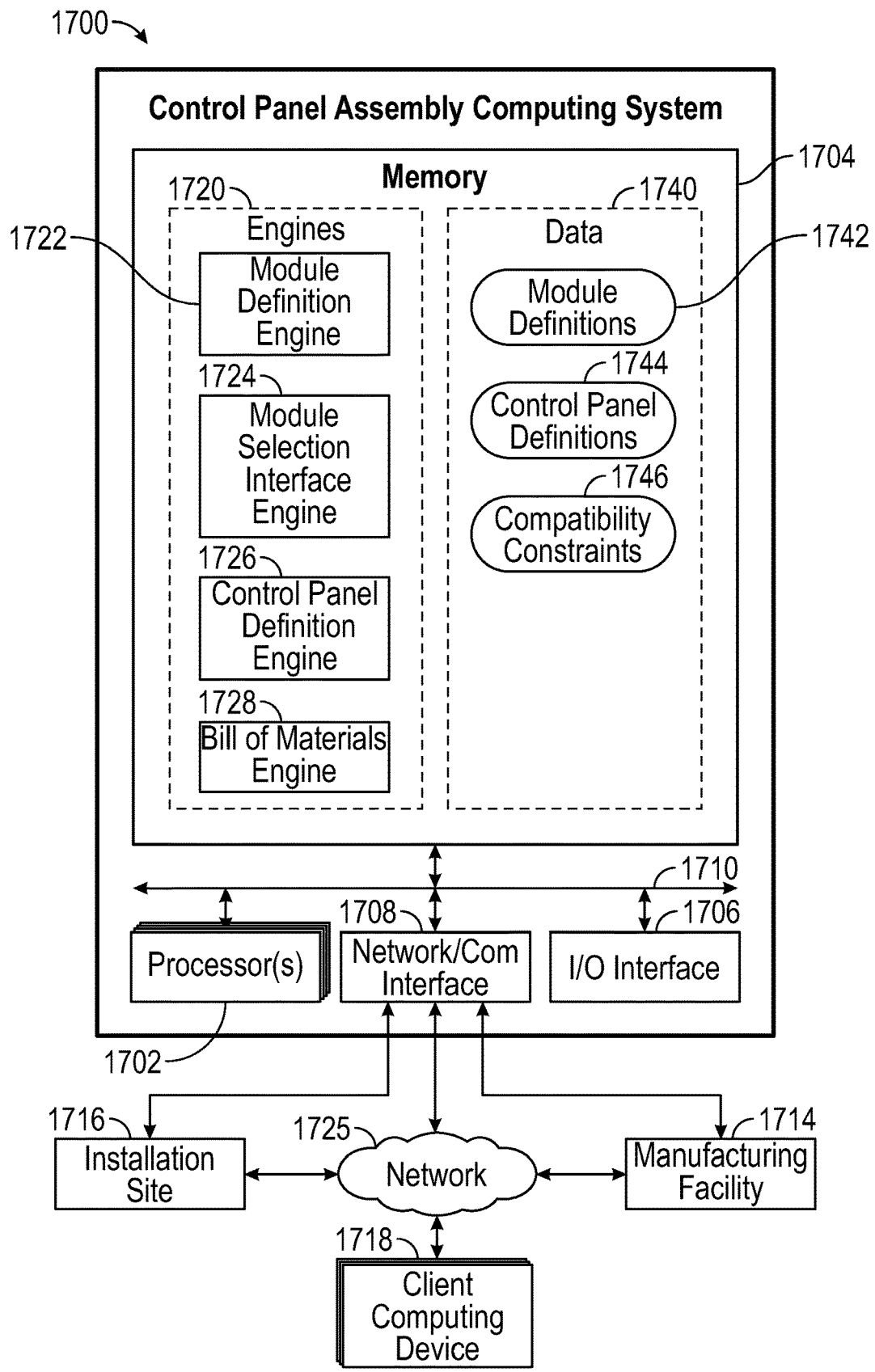
FIG. 17 is a diagram of a computing system of a control panel assembly system, according to one embodiment of the present disclosure.

FIG. 17 is a diagram of a control panel assembly computing system 1700 of a control panel assembly system, according to one embodiment of the present disclosure. The control panel assembly computing system 1700 may include one or more processors 1702, an electronic memory 1704, input/output (I/O) interface(s) 1706, a network/communication interface 1708, and a system bus 1710 interconnecting one or more of these components. The control panel assembly computing system 1700 may be accessible to or otherwise in electronic communication, over a network 1725, with a manufacturing facility 1714, an installation site 1716, and/or one or more client computing devices 1718. As previously described, the control panel assembly computing system 1700 may receive a designation of a set of modules, such as from the client computing device(s) 1718, the installation site 1716, or an engineering services team and generate a BoM to initiate an order for the components of the set of modules. The manufacturing facility 1714 can receive the BoM and procure and/or manufacture the components. The manufacturing and/or procurement of the components can proceed in parallel or otherwise concurrently with any additional engineering associated with the installation site 1716, thereby greatly reducing lead time for customized control panel installation.

The one or more processors 1702 may include one or more general purpose devices, such as an Intel®, AMD®, or other standard microprocessor. The one or more processors 1702 may include a special purpose processing device, such as ASIC, SoC, SiP, FPGA, PAL, PLA, FPLA, PLD, or other customized or programmable device. The one or more processors 1702 perform distributed (e.g., parallel) processing to execute or otherwise implement functionalities of the present embodiments. The one or more processors 1702 may run a standard operating system and perform standard operating system functions. It is recognized that any standard operating systems may be used, such as, for example, Microsoft® Windows®, Apple® MacOS®, Disk Operating System (DOS), UNIX, IRJX, Solaris, SunOS, FreeBSD, Linux®, ffiM® OS/2® operating systems, and so forth.

The electronic memory 1704 may include static RAM, dynamic RAM, flash memory, one or more flip-flops, ROM, CD-ROM, DVD, disk, tape, or magnetic, optical, or other computer storage medium. The electronic memory 1704 may include a plurality of program engines 1720 and program data 1740. The electronic memory 1704 may be local to the control panel assembly computing system 1700 or may be remote from the control panel assembly computing system 1700 and/or distributed over the network 1725.

The program engines 1720 may include all or portions of other elements of the control panel assembly computing system 1700. The program engines 1720 may run multiple operations concurrently or in parallel by or on the one or more processors 1702. In some embodiments, portions of the disclosed modules, components, and/or facilities are embodied as executable instructions embodied in hardware or in firmware, or stored on a non-transitory, machine-readable storage medium. The instructions may comprise computer program code that, when executed by a processor and/or computing device, cause a computing system to implement certain processing steps, procedures, and/or operations, as disclosed herein. The modules, components, and/or facilities disclosed herein, may be implemented and/or embodied as a driver, a library, an interface, an API, FPGA configuration data, firmware (e.g., stored on an EEPROM), and/or the like. In some embodiments, portions of the modules, components, and/or facilities disclosed herein are embodied as machine components, such as general and/or application-specific devices, including, but not limited to: circuits, integrated circuits, processing components, interface components, hardware controller(s), storage controller(s), programmable hardware, FPGAs, ASICs, and/or the like.

The program data 1740 stored on the electronic memory 1704 may include data generated by the control panel assembly computing system 1700, such as by the program engines 1720 or other engines or program modules. The stored program data 1740 may be organized as one or more databases.

The I/O interface 1706 may facilitate interfacing with one or more input devices and/or one or more output devices. The input device(s) may include a keyboard, mouse, touch screen, light pen, tablet, microphone, sensor, or other hardware with accompanying firmware and/or software. The output device(s) may include a monitor or other display, printer, speech or text synthesizer, switch, signal line, or other hardware with accompanying firmware and/or software.

The network interface 1708 may facilitate communication with other computing devices and/or networks 1725, such as the Internet and/or other computing and/or communications networks. The network interface 1708 may be equipped with conventional network connectivity, such as, for example, Ethernet (IEEE 802.3), Token Ring (IEEE 802.5), Fiber Distributed Datalink Interface (FDDI), or Asynchronous Transfer Mode (ATM). Further, the computer may be configured to support a variety of network protocols such as, for example, Internet Protocol (IP), Transfer Control Protocol (TCP), Network File System over UDP/TCP, Server Message Block (SMB), Microsoft® Common Internet File System (CIFS), Hypertext Transfer Protocols (HTTP), Direct Access File System (DAFS), File Transfer Protocol (FTP), Real-Time Publish Subscribe (RTPS), Open Systems Interconnection (OSI) protocols, Simple Mail Transfer Protocol (SMTP), Secure Shell (SSH), Secure Socket Layer (SSL), and so forth.

The system bus 1710 may facilitate communication and/or interaction between the other components of the control panel assembly computing system 1700, including the one or more processors 1702, the electronic memory 1704, the I/O interface 1706, and the network interface 1708.

As noted, the control panel assembly computing system 1700 includes various program engines 1720 (or engines, elements, or components) to implement functionalities of the control panel assembly computing system 1700 and to generate, access, and/or manipulate the program data 1740 stored in the electronic memory 1704. The system modules can include a module definition engine 1722, a module selection interface engine 1724, a control panel definition engine 1726, and a bill of materials engine 1728.

The module definition engine 1722 may receive, generate, format, organize, and otherwise administer module definitions 1742 for modules designed to be independently assembled, tested, and installed. The module definition engine 1722 may store, maintain, reference, and otherwise administer the module definitions 1742 in the program data 1740 stored in the electronic memory 1704.

The module selection interface engine 1724 presents or otherwise provides a selection interface (e.g., to a client computing device) for a user to designate a set of modules for a control panel. The module selection interface engine 1724 may access or otherwise reference the module definitions 1742 in the program data 1740 of the electronic memory 1704. The module selection interface engine 1724 may consult or otherwise access compatibility constraints 1746 in providing interface options on the module selection interface engine 1724, thereby avoiding designations of incompatible modules in a set of modules for a control panel.

The control panel definition engine 1726 may receive, generate, format, organize, and otherwise administer control panel definitions 1744, which may include reference to or incorporation of module definitions 1742. The control panel definition engine 1726 may store, maintain, reference, and otherwise administer the control panel definitions 1744 in the program data 1740 stored in the electronic memory 1704.

The bill of materials engine 1728 can generate or otherwise prepare a BoM based on a received designation of a set of modules for a control panel. The bill of materials engine 1728 may generate a parts list, including quantities of each part, for all the components need to assemble all the modules in a designated set of modules for a control panel. The bill of materials engine 1728 may handle communication of BoMs to the manufacturing facility 1714.

EXAMPLES

Some examples of embodiments of the present disclosure are provided below.

Example 1. An assembly frame (for temporary installation of module components) for assembly of a module of a control panel, comprising: a faceplate frame to accept and support a faceplate of a module (e.g., on a forward surface) to orient a front of the faceplate forward (and selectively downward) and a back of the face plate rearward (and selectively upward) for ease of viewing and access by a user during assembly of a module, the faceplate frame including mounting features to which the faceplate of the of the module is to be mounted; a first side frame pivotably (or otherwise moveably) coupled to a first lateral side of the faceplate frame and rotatable between a first position (e.g., a narrow position, which may be in a plane substantially perpendicular to the faceplate frame) and a second position (e.g., an open position, which may be in a plane at an angle greater than 90 degrees to the faceplate), the first side frame extending rearward from the faceplate frame in the first position and the second position to provide accessibility to the user during assembly, the first side frame including mounting features for temporarily mounting a first cross brace to support components of the module during assembly (e.g., wiring components mounted to the mounting bracket to components mounted to the faceplate) and after permanent mounting of the cross brace during installation of the module into a control panel; and a second side frame coupled to the faceplate frame at a second lateral side that is opposite the first lateral side of the faceplate frame and the first side frame, the second side frame extending rearward from the faceplate frame to provide accessibility to the user during assembly, the second side frame including mounting features for temporarily mounting a second cross brace to support components of the module during assembly (e.g., wiring components mounted to the mounting bracket to components mounted to the faceplate) and after permanent mounting during installation of the module into a control panel, wherein the assembly frame is configured for temporary mounting of module components during wiring and configured for removal of an assembled module to install to a control panel frame.

Example 2. The assembly frame of Example 201, wherein the first side frame in the first position is in a plane perpendicular to the faceplate frame and in the second position is in a plane at an angle greater than 90 degrees to the faceplate extending laterally outward.

Example 3. The assembly frame of Example 1, wherein the second side frame is pivotably coupled to the faceplate frame and rotatable between a first position (e.g., a narrow position) and a second position (e.g., an open position) extending away from the first side frame.

Example 4. The assembly frame of Example 3, wherein the second side frame in the first position is in a plane perpendicular to the faceplate frame and in the second position is in a plane at an angle greater than 90 degrees to the faceplate.

Example 5. The assembly frame of Example 1, where the first and second cross braces include mounting features to which can be mounted one or more of a mounting bracket, a DIN rail, a terminal block, and a circuit breaker.

Example 6. The assembly frame of Example 1, wherein the faceplate frame is coupled to a working surface and oriented at an angle transverse to a plane of the working surface.

Example 7. The assembly frame of Example 1, wherein the faceplate frame is pivotably coupled to a working surface and rotatable between an upright position oriented at (or forming) a right angle to the working surface and a reclined position oriented at (or forming) an acute angle to the working surface.

Example 8. The assembly frame of Example 7, further comprising one or more stabilizers to stabilize the faceplate frame in the upright position and to accommodate the faceplate frame in the reclined position.

Example 9. The assembly frame of Example 1, wherein the faceplate frame is coupled to a working surface, the height of which is adjustable.

Example 10. The assembly frame of Example 1, wherein the faceplate frame is rectangular.

Example 11. A module assembly station for supporting a module of a control panel during assembly, comprising: an assembly surface providing a horizontal work surface; a lift coupled to the assembly surface and configured to adjust a height of the horizontal work surface; a faceplate frame disposed on the horizontal work surface, the faceplate frame to accept and support a faceplate of a module for ease of viewing and access by a user during assembly of a module, the faceplate frame including mounting features to which the faceplate of the of the module is to be mounted; a first side frame pivotably coupled to a first lateral side of the faceplate frame and rotatable between a narrow position and an open position, the first side frame extending rearward from the faceplate frame in the narrow position and the open position to provide accessibility to the user during assembly, the first side frame including mounting features for temporarily mounting a first cross brace to support components of the module during assembly and after permanent mounting of the first cross brace during installation of the module into a control panel; and a second side frame coupled to the faceplate frame at a second lateral side that is opposite the first lateral side of the faceplate frame and the first side frame, the second side frame extending rearward from the faceplate frame to provide accessibility to the user during assembly, the second side frame including mounting features for temporarily mounting a second cross brace to support components of the module during assembly and after permanent mounting during installation of the module into a control panel.

Example 12. The module assembly station of Example 11, further comprising a cart on which the lift is disposed, the cart comprising wheels and providing mobility of the module assembly station.

Example 13. The module assembly station of Example 11, wherein the first side frame in the narrow position is perpendicular to the faceplate frame and in the open position is at an angle greater than 90 degrees for the faceplate extending laterally outward.

Example 14. The module assembly station of Example 11, wherein the second side frame is pivotably coupled to the faceplate frame and rotatable between a narrow position and an open position extending away from the first side frame.

Example 15. The module assembly station of Example 14, wherein the second side frame in the narrow position is perpendicular to the faceplate frame and in the open position is at an angle greater than 90 degrees to the faceplate.

Example 16. The module assembly station of Example 11, wherein the faceplate frame is pivotably coupled to a working surface and rotatable between an upright position oriented perpendicular to the working surface and a reclined position extending forward and upward from the working surface.

Example 17. The module assembly station of Example 11, wherein the faceplate frame is rectangular.

Example 18. The module assembly station of Example 11, wherein the first side frame and second side frame are rectangular.

Example 19. A method of modular control panel assembly comprising: receiving, at a computing system, a designation of a set of modules to be included in a control panel to be assembled to address an application in operating an electrical power system, each module of the set of modules selected from a plurality of modules, each module of the plurality of modules a self-contained solution that performs an electrical function pertaining to operation of the electrical power system, each module of the plurality of modules defined by a module definition that includes data specifying: components to perform the electrical function; a mechanical arrangement of the components to facilitate human interaction, use, and independent manufacture and testing of the module; electrical connections; and logical interactions, including logical connections between the components to perform the electrical function and logical interfaces with other modules or other equipment of the power system, wherein each module is designed to be applicable to different anticipated power system configurations, discretely functional and independently wired, tested, and installed in the control panel; preparing (e.g., generating), by the computing system, a bill of materials for all the components of each and every module of the set of modules, the bill of materials specifying a parts list that includes a part listing for each of the components of all the modules in the set of modules designated, wherein the bill of materials is to be used to order the components according to each part listing in the parts list; assembling each module from the set of modules from the components of the component order, wherein assembling the module includes arranging the one or more components according to a corresponding module definition and the data therein specifying the mechanical interaction, and wherein assembling the module includes wiring the module according to the corresponding module definition, the data therein specifying electrical connections between the components; independently testing each module of the set of modules; and assembling the control panel from the set of modules and according to each module definition and/or according to a panel definition, the assembling including mounting the set of modules to a control panel rack.

Example 20. The method of Example 19, further comprising: defining the plurality of modules with a corresponding module definition, including determining the components, the mechanical arrangement, the electrical connections, and the logical interactions of the module to cover most anticipated power system configurations.

Example 21. The method of Example 20, wherein each module of the plurality modules is defined based on one or more commonly used components of control panels commonly requested by one or more electrical power system operators.

Example 22. The method of Example 21, further comprising identifying the one or more commonly used components of control panels commonly requested by electrical power system operators.

Example 23. The method of Example 19, wherein the bill of materials includes a quantity for each part listing in the bill of materials, and wherein the bill of materials is to be used to instruct (e.g., order) one of manufacture and purchase of components in the quantity corresponding to each part listing in the parts list.

Example 24. The method of Example 19, further comprising presenting, on a computing device, a selection interface providing a listing of modules from which the set of modules is to be selected for assembly.

Example 25. The method of Example 19, wherein the designation of the set of modules is received at the computing system over a communication network from the computing device.

Example 26. The method of Example 25, wherein the designation of the set of modules is received from one of a customer, an operator of the electrical power system, and an engineer (e.g., of an engineering services team).

Example 27. The method of Example 19, further comprising engineering a forthcoming installation of the control panel at an installation site.

Example 28. The method of Example 27, wherein engineering the forthcoming installation of the control panel comprises: obtaining module input data list(s), outage planning list(s), and commissioning plan and checklist(s); performing safety checks; conducting one or more site visits at the installation site; obtaining customer renderings (e.g., drawings) of one or more of: the installation site, an anticipated final rendering of the installation, and an interconnection of the control panel with other site hardware; developing an outage and commissioning plan; generating an engineering drawings package using a design automation tool; transmitting the engineering drawings package(s) to customer; and obtaining approval of the engineering drawings from the customer.

Example 29. The method of Example 19, wherein the one or more components of a module includes an interface device to connect to an interface device of another module (e.g., via wiring) and through which communication occurs between the module and the other module.

Example 30. The method of Example 19, further comprising configuring the logical interaction of the one or more components by: generating one or more settings for the set of modules to configure one or more of the components and the logical interactions of the module, based on the defined electrical connections and specified function requirements; and loading settings into components of the set of modules via the one or more settings load files.

Example 31. The method of Example 30, wherein generating the one or more settings comprises generating one or more settings files and loading the settings comprises uploading the one or more settings files to the components of the set of modules.

Example 32. The method of Example 31, wherein loading the settings comprises applying the settings to the components of the set of modules over a network connection.

Example 33. The method of Example 19, wherein independently testing each module includes one or more of: testing to verify settings of each module; and current injection testing.

Example 34. The method of Example 19, further comprising testing that the control panel correctly addresses the application in operating the electrical power system.

Example 35. The method of Example 19, wherein the function pertaining to operation of the electrical power system is one of distance protection, overcurrent protection, transformer differential protection, differential protection, voltage protection, voltage control, frequency control, breaker control, peak metering, demand metering, revenue metering, and power quality metering.

Example 36. The method of Example 19, wherein the application in operating the electrical power system comprises a plurality of functions pertaining to operation of the electrical power system, each function of the plurality of functions performed by a module.

Example 37. The method of Example 36, wherein the plurality of functions are to physically reside together to achieve the application in operating the electrical power system.

Example 38. The method of Example 19, wherein the application in operating the electrical power system is associated with a main component of the electrical power system.

Example 39. The method of Example 19, wherein the application in operating the electrical power system comprises one of: line protection, control, and monitoring; transformer protection, control and monitoring; bus protection, control and monitoring; feeder protection, control and monitoring; and capacitor bank.

Example 40. The method of Example 19, further comprising installing the control panel at an installation site.

Example 41. The method of Example 40, wherein installing the control panel includes: mobilizing for construction; verifying and performing a safety plan; implementing an isolation plan (switching orders); implementing a demolition plan (including panel cuts); installing and wiring the control panel to one or more of adjacent hardware and the electrical system (using checklists); performing functional tests on the control panel; putting an associated zone of the electrical power system into service per switching orders; and updating the engineering drawings package to reflect changes made during installation to produce a final engineering drawings package that documents the control panel as-installed.

Example 42. A method of modular control panel assembly comprising: defining, on a computing system, a plurality of modules with a module definition, each module to be a self-contained solution to an electrical function pertaining to operation of an electrical power system, each module definition to include data specifying: components to perform the electrical function; mechanical arrangement of the components; electrical connections, including connections between the components and points of interface with other modules and other equipment of the power system; and logical interaction, including logical connections between the components and logical interfaces with other modules or other equipment of the power system, wherein each module is designed to be independently wired, tested, and installed in a control panel; receiving, at the computing system, a designation of a set of modules to be included in a control panel to be assembled, wherein each module of the set of modules is selected from the plurality of modules defined; preparing a bill of materials for all components of every module of the set of modules, the bill of materials specifying a parts list that includes a part listing for each of the one or more components of all the modules in the set of modules designated, the bill of materials including a quantity for each part listing in the bill of materials, wherein the bill of materials to be used to instruct/order one of manufacture and purchase of components in the quantity corresponding to each part listing in the parts list; engineering a forthcoming installation of the control panel; assembling each module from the set of modules from the components of the component order, wherein assembling the module includes wiring according to a corresponding module definition and the data therein specifying the mechanical arrangement and the electrical connections between the one or more components; independently testing each module of the set of modules, including: testing to verify settings of each module; current injection testing; assembling the control panel from the set of modules and according to each module definition; and installing the control panel at the site.

Example 43. The method of Example 42, further comprising testing the control panel.

Example 44. The method of Example 42, further comprising identifying the one or more commonly used components of control panels commonly requested by electrical power system operators.

Example 45. The method of Example 42, wherein the designation of the set of modules is received from one of a customer, an operator of the electrical power system, and an engineer of an engineering services team.

Example 46. The method of Example 42, wherein engineering the forthcoming installation of the control panel comprises: obtaining one or more of a module input data list, outage planning list, and commissioning plan and checklist; performing safety checks; obtaining drawings of one or more of: the installation site, an anticipated final rendering of the installation, and an interconnection of the control panel with other site hardware; developing an outage and commissioning plan; and generating an engineering drawings package for approval using a design automation tool.

Example 47. The method of Example 42, further comprising configuring the logical interaction of the one or more components by: generating one or more settings for the set of modules to configure one or more of the components and the logical interactions of the module, based on the defined electrical connections and specified function requirements;

and loading settings into components of the set of modules via the one or more settings load files.

Example 48. The method of Example 42, wherein independently testing each module includes one or more of: testing to verify settings of each module; and current injection testing.

Example 49. The method of Example 42, wherein the application in operating the electrical power system comprises a plurality of functions pertaining to operation of the electrical power system, wherein the module performs one function of the plurality of functions performed, and wherein the plurality of functions are to physically reside together to achieve the application in operating the electrical power system.

Example 50. A method of modular control panel assembly comprising: identifying commonly used components of control panels; designing a plurality of modules each to include one or more of the commonly used components, the module to be independently (or discretely) wired, tested, and installed in a control panel; defining a plurality of modules each to include one or more commonly included components of traditionally customized control panels, each module definition to include data providing or specifying one or more electrical components to perform an electrical function pertaining to operation of an electrical power system; a mechanical arrangement of the components to facilitate human interaction, use, and independent manufacture and testing of the module; electrical connections, including connections between the components and connections comprising points of interface with other modules and other equipment of the power system; and defined logical interactions, including logical connections between the components to perform the electrical function and logical interfaces with other modules or other equipment of the power system, wherein each module is designed to be independently (or discretely) wired, tested, and installed in a control panel; presenting (e.g., to a customer), an interface providing a listing or representation of types of modules to be selected for inclusion in a set of modules to be assembled into or otherwise included in a control panel; receiving (e.g., from the customer) input designating a set of modules to be assembled into (or otherwise included in) the control panel to be assembled, wherein each module of the set of modules is selected from the plurality of modules defined; preparing (e.g., generating) a bill of materials for all components of each module of the set of modules, the bill of materials specifying a parts list that includes a part listing for each of the one or more components of all the modules in the set of modules designated, the bill of materials including a quantity for each part listing in the bill of materials, wherein the bill of materials to be used to instruct/order one of manufacture and purchase of components in the quantity corresponding to each part listing in the parts list; engineering a forthcoming installation of the control panel including: obtaining module input data list(s), outage planning list(s), and commissioning plan and checklist(s); performing safety checks; conducting site visits; obtaining customer drawings renderings of one or more of an installation site, an anticipated final rendering, an interconnection of the control panel with other site hardware; developing an outage and commissioning plan; generating engineering drawings package using a design automation tool; transmitting Issued For Review (IFR) drawings package(s) to the customer; obtaining approval from the customer; assembling each module from the set of modules from the components of the component order, wherein assembling the module includes wiring according to a corresponding module definition and the data therein; generating demolition drawings; performing a Short Circuit Study (SCS); creating a report of the SCS and transmitting the report to customer; generating one or more settings load files for the set of modules; obtain approval from customer, based on SCS and one or more settings load files; loading settings into components of the set of modules via the one or more settings load files; testing each module of the set of modules, including: testing to verify settings of each module; current injection testing, wherein each module is independently tested; generating one or more reports on testing the set of modules; transmit the reports for approval to one or more of the customer and an engineering services team; obtain approval from customer to ship the control panel; installing the control panel at the site, including: mobilizing for construction; verifying and perform a safety plan; implementing isolation plan (switching orders); implementing demolition plan (including panel cuts); installing and wiring control panel (e.g., to at least one of adjacent hardware and the electrical power system (e.g., using checklists); performing functional tests on control panel; putting zone of electrical power system into service per switching orders; and updating redlines.

Example 51. A control panel for operation of an electrical power system, comprising: a control panel frame including a front support and a back support; and a set of modules selected from a plurality of pre-defined modules, each module of the plurality of modules discretely wired and self-contained to independently perform an electrical function pertaining to operation of an electrical power system, each module including: components to perform the electrical function; a mechanical arrangement of the components to facilitate human interaction, use, and independent manufacture and testing of the module; electrical connections, including connections between the components and connections comprising points of interface with other modules and other equipment of the power system; and defined logical interactions, including logical connections between the components to perform the electrical function and logical interfaces with other modules or other equipment of the power system, wherein each module is mounted in the control panel frame after being independently assembled.

Example 52. The control panel of Example 51, wherein the front support of the control panel frame is configured to receive a module face plate, and wherein each module of the set of modules comprises a faceplate to be mounted to the front support and to support and present components intended for human interaction.

Example 53. The control panel of Example 51, wherein the components of a first module include an interface device to connect to an interface device of a second module (e.g., via wiring) and through which communication occurs between the first module and the second module.

Example 54. The control panel of Example 51, wherein at least one of the modules includes components with configurable settings that are configured according to specifications of an installation site of the control panel.

Example 55. The control panel of Example 51, wherein the control panel is to address an application in operating the electrical power system.

Example 56. The control panel of Example 55, wherein the application in operating the electrical power system comprises one of: line protection, control, and monitoring; transformer protection, control and monitoring; bus protection, control and monitoring; feeder protection, control and monitoring; and capacitor bank protection, control and monitoring.

Example 57. The control panel of Example 55, wherein the application comprises a plurality of functions pertaining to operation of the electrical power system each performed by a module.

Example 58. The control panel of Example 51, wherein each module of the plurality of modules is configured for compatibility with every other module of the plurality of modules.

Example 59. The control panel of Example 51, wherein each module of the set of modules is pre-defined (e.g., prior to assembly of the control panel) by a module definition that includes data specifying the components to perform the electrical function, a mechanical arrangement of the components, the electrical connections, and the logical interaction of the components to perform the electrical function, wherein each module is designed to be discretely functional and independently wired, tested, and installed in a control panel.

Example 60. The control panel of Example 51, further comprising one or more wiring harnesses creating one or more of the electrical connections between the components.

Example 61. The control panel of Example 60, wherein the one or more wiring harnesses further create electrical connections at the points of interface with other modules and other equipment of the power system.

Example 62. The control panel of Example 51, wherein the control panel frame has dimensions according to a predetermined standard size.

Example 63. The control panel of Example 51, further comprising one or more cross braces extending between the front support and the back support, the one or more cross braces to delineate between different modules of the set of modules.

Example 64. The control panel of Example 63, wherein each module of the set of modules further comprises one or more DIN rails extending between two cross braces, each of the one or more DIN rails configured to have mounted thereto components of the module.

Example 65. The control panel of Example 51, wherein the function pertaining to operation of the electrical power system is one of distance protection, overcurrent protection, transformer differential protection, differential protection, voltage protection, voltage control, frequency control, breaker control, peak metering, demand metering, revenue metering, and power quality metering.

Example 66. The control panel of Example 51, wherein the function pertaining to operation of the electrical power system is one of distance protection, overcurrent protection, transformer differential protection, differential protection, voltage protection, voltage control, frequency control, breaker control, peak metering, demand metering, revenue metering, and power quality metering.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. Those having skill in the art will recognize that many changes may be made to the details of the above-described embodiments without departing from the underlying principles of the invention. The scope of the present invention should, therefore, be determined only by the following claims.

The invention claimed is:

1. An assembly frame for assembly of a module of a control panel, comprising:

a faceplate frame configured to accept and support a faceplate of the module to orient a front of the faceplate forward and a back of the face plate rearward for ease of viewing and access by a user during assembly of the module, the faceplate frame including mounting features to which the faceplate of the module is to be mounted;

a first side frame pivotably coupled to a first lateral side of the faceplate frame and rotatable between a first position and a second position, the first side frame extending rearward from the faceplate frame in the first position and the second position to provide accessibility to the user during assembly, the first side frame including mounting features to temporarily mount a first cross brace to support components of the module during assembly and after permanent mounting of the cross brace during installation of the module into a control panel frame; and a second side frame coupled to the faceplate frame at a second lateral side that is opposite the first lateral side of the faceplate frame and the first side frame, the second side frame extending rearward from the faceplate frame to provide accessibility to the user during assembly, the second side frame including mounting features to temporarily mount a second cross brace to support components of the module during assembly and after permanent mounting during installation of the module into the control panel frame, wherein the faceplate frame, the first side frame, and the second side frame of the assembly frame are configured for temporary mounting of components of the module, the faceplate of the module, the first cross brace, and the second cross brace respectively during wiring and mounting of the components of the module to the faceplate of the module, the first cross brace, and the second cross brace respectively to form an assembled module and configured for removal of the assembled module to install the assembled module to the control panel frame.

2. The assembly frame of claim 1, wherein the first side frame in the first position is in a plane perpendicular to the faceplate frame and in the second position is in a plane at an angle greater than 90 degrees to the faceplate extending laterally outward.

3. The assembly frame of claim 1, wherein the second side frame is pivotably coupled to the faceplate frame and rotatable between a first position and a second position extending away from the first side frame.

4. The assembly frame of claim 3, wherein the second side frame in the first position is in a plane perpendicular to the faceplate frame and in the second position is in a plane at an angle greater than 90 degrees to the faceplate.

5. The assembly frame of claim 1, where the first and second cross braces include mounting features to which can be mounted one or more of a mounting bracket, a DIN rail, a terminal block, and a circuit breaker.

6. The assembly frame of claim 1, wherein the faceplate frame is coupled to a working surface and oriented at an angle transverse to a plane of the working surface.

7. The assembly frame of claim 1, wherein the faceplate frame is pivotably coupled to a working surface and rotatable between an upright position oriented at a right angle to the working surface and a reclined position oriented at an acute angle to the working surface.

8. The assembly frame of claim 7, further comprising one or more stabilizers to stabilize the faceplate frame in the upright position and to accommodate the faceplate frame in the reclined position.

9. The assembly frame of claim 1, wherein the faceplate frame is coupled to a working surface, the height of which is adjustable.

10. The assembly frame of claim 1, wherein the faceplate frame is rectangular.

* * * * *